(12) United States Patent
Lee et al.

(10) Patent No.: US 7,511,334 B2
(45) Date of Patent: Mar. 31, 2009

(54) TWIN-ONO-TYPE SONOS MEMORY

(75) Inventors: Yong-kyu Lee, Suwon (KR); Jeong-uk Han, Suwon (KR); Sung-taeg Kang, Seoul (KR); Jong-duk Lee, Seoul (KR); Byung-gook Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/296,397

(22) Filed: Dec. 8, 2005

(65) Prior Publication Data

US 2006/0086953 A1 Apr. 27, 2006

Related U.S. Application Data

(63) Continuation of application No. 10/781,761, filed on Feb. 20, 2004, now Pat. No. 7,005,349.

(30) Foreign Application Priority Data

Apr. 1, 2003 (KR) .................................. 03-20444

(51) Int. Cl.
*H01L 27/088* (2006.01)
*H01L 21/336* (2006.01)
(52) U.S. Cl. ................. 257/324; 257/315; 257/316; 257/321; 257/E29.309; 438/261; 438/264
(58) Field of Classification Search ......... 257/314–326, 257/E29.309; 438/257–267
See application file for complete search history.

(56) References Cited

U.S. PATENT DOCUMENTS 6,248,633 B1 6/2001 Ogura et al.

6,339,006 B1 1/2002 Lee et al.
6,462,375 B1 * 10/2002 Wu ............................. 257/316

(Continued)

FOREIGN PATENT DOCUMENTS

DE 100 36 911 A1 2/2002

(Continued)

OTHER PUBLICATIONS

Lusky, et al., "Characterization of Channel Hot Electron Injection by the Subthreshold Slope of NROM Device", IEEE Electron Device Letters, 22(11):556-558 (Nov. 2001).

(Continued)

*Primary Examiner*—Douglas M Menz
*Assistant Examiner*—Matthew W Such
(74) *Attorney, Agent, or Firm*—Lee & Morse, P.C.

(57) ABSTRACT

A twin-ONO-type SONOS memory includes a semiconductor substrate having a source region, a drain region and a channel region between the source and drain regions, twin silicon oxide-silicon nitride-silicon oxide (ONO) dielectric layers, a first ONO dielectric layer being on the channel region and the source region and as second ONO dielectric layer being on the channel region and the drain region, and a control gate on the channel region, between the twin ONO dielectric layers, the twin ONO dielectric layers extending along at least lower lateral sides of the control gate adjacent the channel region, wherein the twin ONO dielectric layers extend towards the source and drain regions further than the control gate.

23 Claims, 19 Drawing Sheets

U.S. PATENT DOCUMENTS

| | | | |
|---|---|---|---|
| 6,479,858 B2* | 11/2002 | Krivokapic | 257/314 |
| 6,512,263 B1 | 1/2003 | Yuan et al. | |
| 6,518,110 B2* | 2/2003 | Wen | 438/201 |
| 6,531,350 B2 | 3/2003 | Satoh et al. | |
| 6,670,240 B2 | 12/2003 | Ogura et al. | |
| 6,673,677 B2 | 1/2004 | Hofmann et al. | |
| 6,706,599 B1* | 3/2004 | Sadd et al. | 438/261 |
| 6,784,476 B2 | 8/2004 | Kim et al. | |
| 6,858,497 B2* | 2/2005 | Moriya et al. | 438/262 |
| 6,960,505 B2* | 11/2005 | Hofmann et al. | 438/257 |
| 2002/0072170 A1 | 6/2002 | Lam | |
| 2003/0011020 A1* | 1/2003 | Eitan | 257/314 |
| 2003/0032243 A1* | 2/2003 | Ogura et al. | 438/257 |
| 2003/0067030 A1* | 4/2003 | Torii | 257/315 |
| 2003/0075756 A1 | 4/2003 | Suzuki | |
| 2003/0080372 A1* | 5/2003 | Mikolajick | 257/315 |
| 2003/0134475 A1* | 7/2003 | Hofmann et al. | 438/257 |
| 2003/0143792 A1* | 7/2003 | Satoh et al. | 438/197 |
| 2003/0160280 A1* | 8/2003 | Yoshino | 257/324 |
| 2003/0178671 A1* | 9/2003 | Takahashi | 257/315 |
| 2004/0000689 A1* | 1/2004 | Lai et al. | 257/315 |
| 2004/0183106 A1* | 9/2004 | Kim et al. | 257/239 |
| 2004/0183126 A1* | 9/2004 | Bae et al. | 257/324 |

FOREIGN PATENT DOCUMENTS

| | | |
|---|---|---|
| DE | 102 03 762 A1 | 8/2002 |
| WO | WO 0211145 A2 * | 2/2002 |
| WO | WO 02/058136 A1 | 7/2002 |

OTHER PUBLICATIONS

Lusky, et al., "Electronics Retention Model for Localized Charge in Oxide-Nitride-Oxide (ONO) Dielectric", IEEE Electroni Device Letters, 23(9):556-668, (Sep. 2002).

* cited by examiner

DECAY RATE OF DISTRIBUTION CENTER:

$$N(t) = \int_0^\infty n_0(\tau) \cdot \exp(-\frac{t}{\tau}) d\tau$$

TWIN-ONO-TYPE SONOS MEMORY

CROSS REFERENCE TO RELATED APPLICATION

This is a continuation application based on application Ser. No. 10/781,761, filed Feb. 20, 2004 now U.S. Pat. No. 7,005,349, the entire contents of which is hereby incorporated by reference.

BACKGROUND OF THE INVENTION

1. Field of the Invention

The present invention relates to a semiconductor memory device. More particularly, the present invention is directed to a twin-ONO-type SONOS memory device, which can function as a 2-bit operating memory device with asymmetric programming.

2. Description of the Related Art

In recent years, nonvolatile semiconductor memory devices have been used in various applications. Nonvolatile semiconductor memory devices can not only electrically erase and program data but also retain data even during interruption of power supply. An example of a nonvolatile semiconductor memory device is a flash memory cell.

Conventionally, stack-gate-type flash memories, in which floating gates and control gates are stacked, have been developed and produced in mass. Floating gates are intended for programming charges, and control gates are intended for controlling the floating gates.

As capacitances of memory devices become larger and the number of gate arrays required for forming complicated circuits increases, techniques of forming fine patterns with a sub-0.10-μm linewidth become indispensable. Although conventional stack-gate-type nonvolatile memory cells have been constantly scaled down, photolithographic and etching processes for forming hyperfine devices are about to reach the technical limits. That is, in addition to scaling vows, patterning a structure in which a floating gate and a control gate are stacked becomes complicated due to a high step difference or a high aspect ratio.

On the other hand, research on SONOS (or MONOS) nonvolatile cells with trapped charges has also progressed to develop single-gate structures such as MOSFETs.

FIG. 1 illustrates a schematic cross-sectional view of a typical SONOS memory cell.

Referring to FIG. 1, to form a SONOS (or MONOS) cell, a source and a drain 15 are formed in a semiconductor substrate 10, such as a p-Si substrate, and then an oxide-nitride-oxide (ONO) dielectric layer 20 and a gate 30 are sequentially formed on the semiconductor substrate 10. The SONOS cell uses the ONO dielectric layer 20 in place of a gate oxide layer of a transistor. In the SONOS cell, a floating gate for programming charges is replaced by the ONO dielectric layer 20. Thus, electrons or holes are injected into a silicon nitride layer 23 sandwiched between thin silicon oxide layers 21 and 25 included in the ONO dielectric layer 20.

Since the ONO dielectric layer 20 is about 10 to 20 nm thick, the step difference is not very much. Therefore, scaling down the SONOS cell within a permitted photolithographic limit is relatively easy. Also, a number of additional processes related to the floating gates can be omitted, thus simplifying the entire manufacturing process.

Meanwhile, for several years, some manufacturers have adopted SONOS memories for obtaining highly integrated nonvolatile memory devices. These manufacturers proposed and attempted to manufacture 2-bit SONOS memories that use asymmetric programming without floating gates.

FIG. 2 is a schematic diagram illustrating the operations of a typical 2-bit memory device when a voltage VDS is applied from a drain to a source in the memory device.

Referring to FIG. 2, a 2-bit memory technique enables the 2-bit memory device to be twice as much integrated as a conventional stack-gate-type flash device having the same area. A 2-bit memory operation comprises: (i) forwardly injecting electrons into a portion of a silicon nitride layer 23 positioned at an edge of a gate 30 by applying a high voltage to a control gate 30 and one of source and drain junctions 15 of a transistor, i.e., by using channel hot electron injection (CHEI), and (ii) reversely reading data by applying a voltage to the gate 30 and the other source and drain.

An erasing operation comprises applying a high voltage to a drain junction 15 and grounding the gate 30 and a substrate 10 bulk. Thus, the programmed electrons in the silicon nitride layer 23 are combined with holes using band-to-band tunneling (BtBT) in an overlap region between the gate 30 and a junction 15.

In an asymmetric charge trap operation, when the linewidth of the gate is relatively high, a spatial interval between programmed traps is sufficient enough that no serious problem occurs in the 2-bit operation. However, as the linewidth of the gate 30 is reduced to about 0.10 μm or less, the 2-bit memory characteristics may be degraded. This is because the charges trapped in the ONO dielectric layer 20 by the CHEI have a certain degree of dispersion, which increases with operation time.

Inset of FIG. 3A illustrates a spatial distribution graph of charges in a typical SONOS, the charges being injected into the silicon nitride layer 23 after memory programming. Variation of drain current with gate voltage in a fresh cell and in an already programmed cell is illustrated in FIG. 3A. FIG. 3B illustrates a retention characteristic of a typical SONOS, which results from a redistribution of injected charges with operation time (t).

In a typical SONOS, in programming by CHEI, charges are injected into the silicon nitride layer. The distribution graph of the charges is obtained using a simulation model as shown in FIG. 3A. That is, charge distribution in each of a fresh cell and a programmed cell is obtained by simulation fitting. Referring to FIG. 3B, since the injected charges are redistributed in time (t), the charge retention characteristic is degraded. The decay rate N(t) of a distribution center can be expressed by the equation shown in FIG. 3B. Referring to FIG. 3B, as time t tends to t', the height of the distribution graph decreases, raising the degree of dispersion.

If, in a SONOS, charges are scattered after programming and charges programmed in a central channel region are not completely erased in repetition of programming and erasing, residual charges may be accumulated on the channel region. The accumulated charges may deteriorate the SONOS endurance. Similarly, after hole charges are programmed, accumulated holes may make the endurance of the device poor.

FIGS. 4A and 4B are graphs illustrating the endurance of a typical SONOS. Variation of cell threshold voltage with number of programming and erasing cycles is illustrated in FIGS. 4A and 4B.

In FIG. 4A, initially, a substrate bulk and a source of a SONOS cell are grounded. After programming and erasing are repeated, the endurance curve is obtained as shown in FIG. 4A. Here, the programming is performed by applying 11 V and 6 V to a gate and a drain, respectively, for 100 μs, and the erasing is performed by applying 0V, 10V, 10V, and 0V to the gate, the drain, the source, and the substrate bulk, respectively, for 100 μs. Reference numeral 41 denotes a case where the cell is turned on, while reference numeral 45 denotes a case where the cell is turned off.

In FIG. 4B, only erasing conditions are changed from the case of FIG. 4A. That is, erasing is performed by applying 0V, 10V, 4V, and 0V to a gate, a drain, a source, and a substrate bulk, respectively. Here, an electric field is formed between the source and the drain so that holes formed by band-to-band tunneling (BtBT) can be efficiently injected into a central channel region. Reference numeral 43 denotes a case where a cell is turned on, while reference numeral 47 denotes a case where the cell is turned off.

Based on the results, it can be inferred that a tail of electron dispersion exists in the central channel region at a certain level. Although there is a possibility that the distribution of electrons or holes in an ONO dielectric layer can be minimally adjusted by optimization of process conditions or by appropriate control of driving voltage, shorter and shorter gate lengths cannot assure the 2-bit characteristics anymore.

SUMMARY OF THE INVENTION

With a view towards minimizing or avoiding the shortcomings and problems of the prior art, the present invention provides a SONOS memory, in which ONO dielectric layers disposed under a gate are physically separated from each other to form a precisely symmetric structure.

According to an embodiment of the present invention, a SONOS memory may include a semiconductor substrate having a source region, a drain region and a channel region between the source and drain regions, twin silicon oxide-silicon nitride-silicon oxide (ONO) dielectric layers, a first ONO dielectric layer being on the channel region and the source region and as second ONO dielectric layer being on the channel region and the drain region, and a control gate on the channel region, between the twin ONO dielectric layers, the twin ONO dielectric layers extending along at least lower lateral sides of the control gate adjacent the channel region, wherein the twin ONO dielectric layers extend towards the source and drain regions further than the control gate.

Each portion of the twin ONO dielectric layers may be adjacent the control gate. At least one portion, e.g., an upper portion, of the twin ONO dielectric layers may be coextensive with a height of the control gate. An upper portion of the twin ONO dielectric layers may be coextensive with the height of the control gate. The upper portion may extend down to the channel region, between remaining portions of the twin ONO dielectric layers and the control gate. The upper portion may further extend under the control gate, between the control gate and the channel region.

The at least one portion may extend from the twin ONO dielectric layers over the channel region. The at least one portion may extend from the twin ONO dielectric layers over the source and drain regions. The control gate may be on the twin ONO dielectric layers. The at least one portion may extend from the twin ONO dielectric layers over the source and drain regions. The at least one portion may be an upper silicon oxide layer.

The SONOS memory may include a gate dielectric layer separating a portion of the control gate over the channel region from a portion of the control gate over the twin ONO dielectric layers. The gate dielectric layer may extend between the twin ONO dielectric layers and the portion of the control gate over the channel region. The gate dielectric layer may extend below the portion of the control gate over the channel region. The portion of the control gate over the channel region may be higher than the portion of the control gate over the twin ONO dielectric layers. An insulating material may be on the portion of the control gate over the twin ONO dielectric layers.

An insulating spacer may be formed on sidewalls of the control gate and the twin ONO dielectric layers. A gate dielectric layer may separate the control gate and the twin ONO dielectric layers. Insulating layers may be on the twin ONO dielectric layers, the gate dielectric layer separating the insulating layers and the control gate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
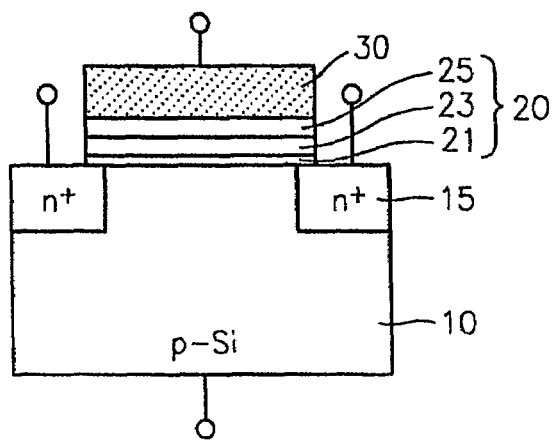
FIG. 1 is a schematic diagram illustrating a cross-sectional view of a typical SONOS memory cell.
Figure 2:
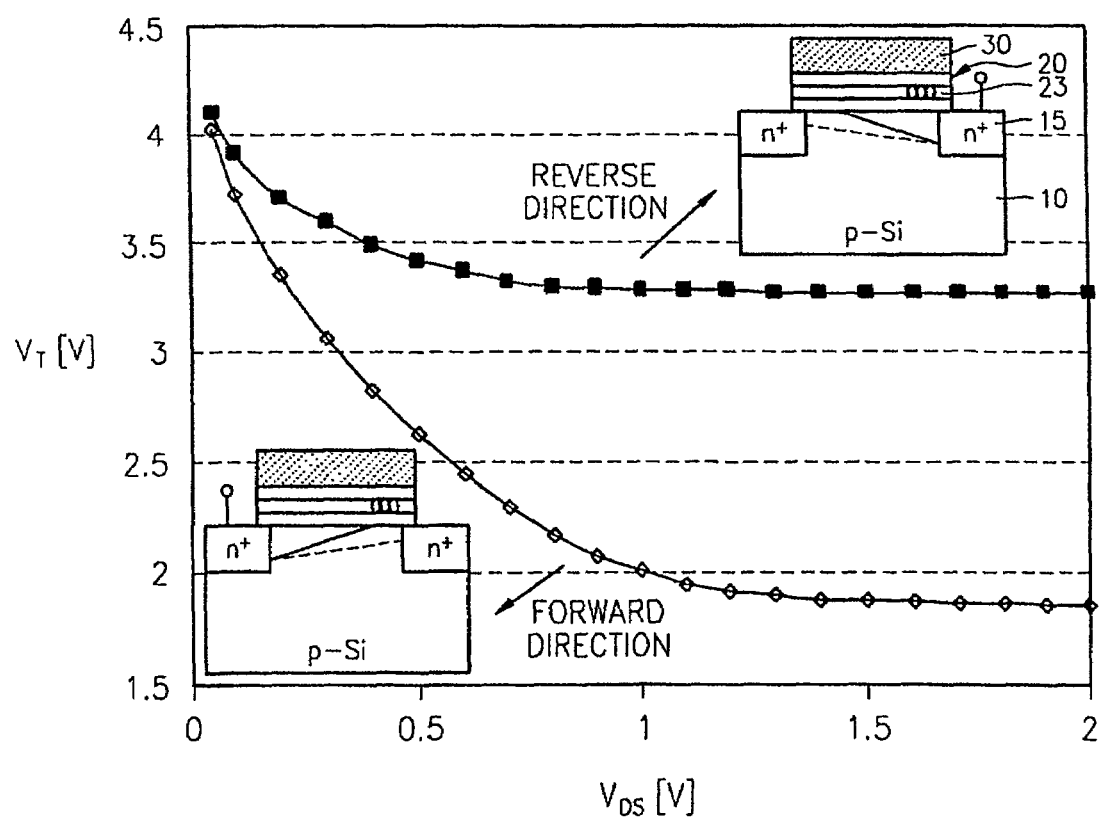
FIG. 2 is a schematic diagram illustrating operations of a typical 2-bit memory device.
Figure 3A:
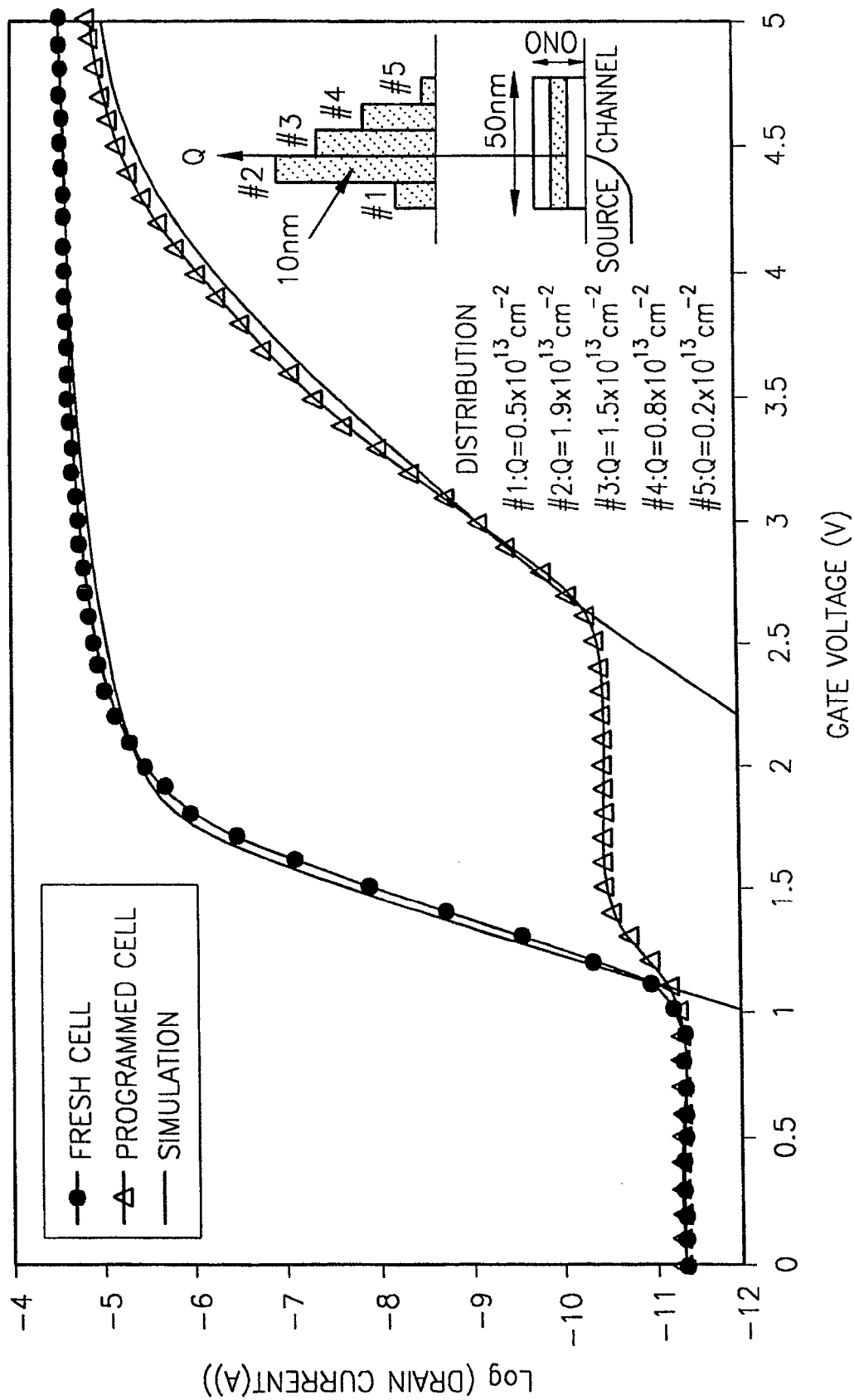
FIG. 3A illustrates a distribution graph of charges, which are injected into a silicon nitride layer after programming, in a typical SONOS.
Figure 3B:
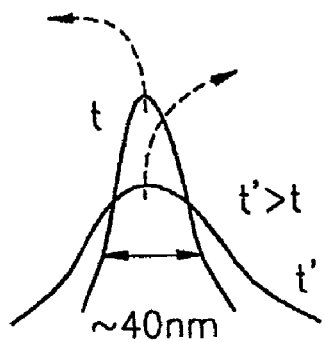
FIG. 3B illustrates a retention characteristic of a typical SONOS, which results from redistribution of injected charges in time (t)
Figure 3B:
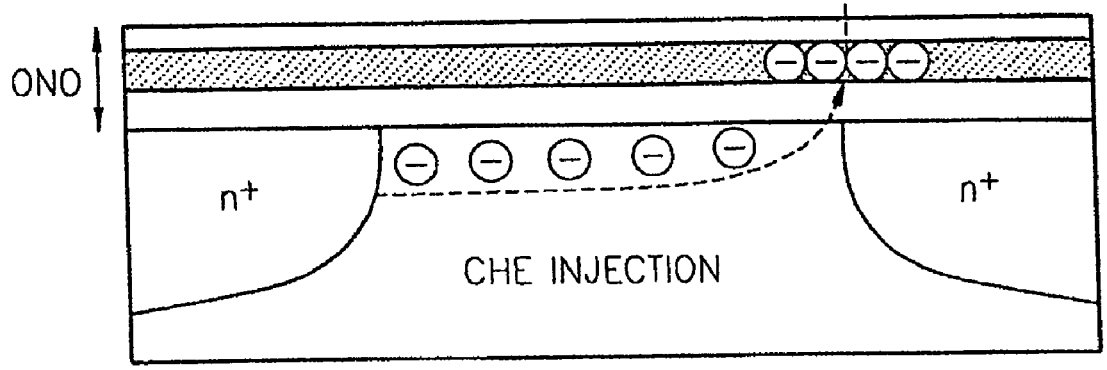
Figure 4A:
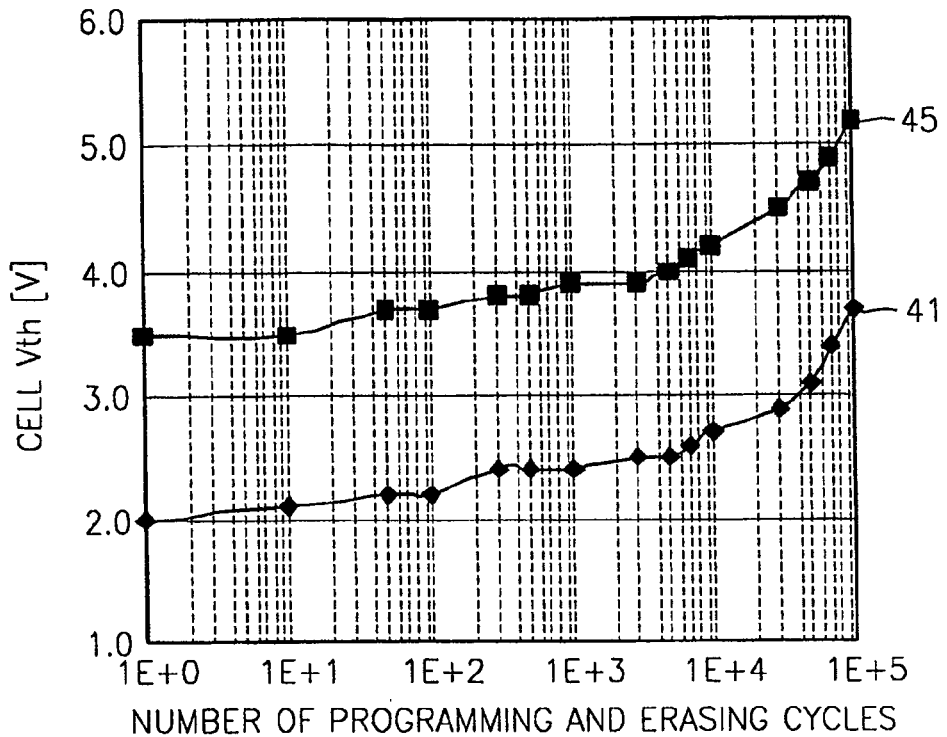
FIGS. 4A and 4B are graphs illustrating an endurance curve of a typical SONOS.
Figure 4B:
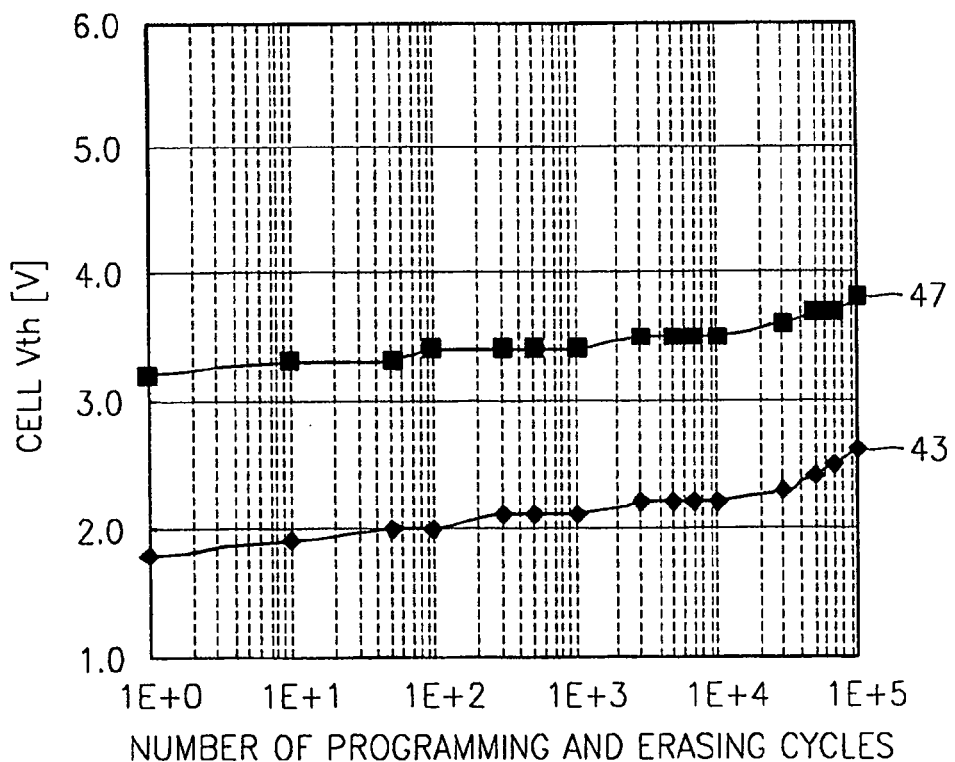

Korean Patent Application No. 2003-20444, filed on Apr. 1, 2003, and, entitled: "Method of Manufacturing Twin-ONO-Type SONOS Memory Using Reverse Self-Alignment Process", is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

The nitride layer in the ONO dielectric layers is intended for the purpose of charge trapping. Such charge trapping layers have charge trapping sites that have good trapping ability for both electrons and holes. Though the exemplary embodiments of the present invention are described below using the nitride layer, e.g., silicon nitride layer, as the charge-trapping layer, any other insulating material having a charge trapping property may be used as the charge trapping layer and are also included within the scope of this invention. For example, an oxide layer with defects, an $Al_2O_3$ layer etc. may also be used as the charge-trapping layer.

The present invention will now be described more fully with reference to the accompanying drawings, in which preferred embodiments of the invention are shown.

According to the embodiments of the present invention, in the sub-100-nm regime, a 2-bit SONOS memory using CHEI includes two portions of ONO dielectric layers disposed under a gate, which are physically separated from each other in order to appropriately adjust dispersion of electrons or holes generated during repeated programming and erasing cycles. Thus, by appropriately adjusting the thickness of a gate oxide layer formed on a portion of a substrate between the two-separated ONO dielectric layers, a short channel phenomenon can be minimized.

Also, the embodiments of the present invention provide a series of processing methods for manufacturing a next-generation 2-bit SONOS memory through a reverse self-alignment process using spacers. This leads to solutions not only to the alignment error between a gate and an ONO dielectric layer, which gets more serious with a reduction in the gate linewidth, but also to limitations on the minimum linewidth required for photolithography. Also, an ONO dielectric layer to be disposed under a gate can be separated into two portions to form a precisely symmetric structure.

The embodiments of the present invention can be categorized into two groups according to structural types. The first group belongs to a single-gate structure, in which while the total gate dimension remains the same as in a conventional structure, and the ONO dielectric layer is separated into two portions instead of a single ONO dielectric layer in the conventional structure. The second group belongs to a triple-gate structure, in which the linewidth and the total gate dimension are the same as those of the single-gate SONOS. The triple-gate structure includes two gates disposed on two-separated ONO dielectric layers and a third (intermediate) gate formed on a silicon oxide layer disposed between the two-separated ONO dielectric layers. In the triple-gate structure, different amounts of voltages can be applied to the 3 gates.

EMBODIMENT 1

A Twin-ONO-Type SONOS with a Single Gate

FIGS. 5A through 5K are schematic cross-sectional views illustrating a twin-ONO-type SONOS memory according to a first embodiment of the present invention.

Figure 5A:
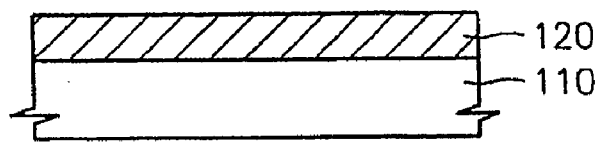
FIGS. 5A through 5K are schematic cross-sectional views illustrating a twin-ONO-type SONOS memory according to a first embodiment of the present invention.

Referring to FIG. 5A, as a starting material for manufacturing a SONOS memory, a p-type substrate is prepared. For example, as shown in FIG. 5A, a silicon (120)-on-insulator (110) (SOI) substrate is prepared. Here, the SOI substrate exhibits p-type conductivity and serves as a p-type substrate. However, a typical bulk silicon substrate may be substituted for the SOI substrate. Afterwards, a field region is formed using a device isolation technique on the silicon layer 120, to define an active region. The device isolation technique may be, for example, a shallow trench isolation, a self-aligned shallow trench isolation, or a LOCOS.

Figure 5B:
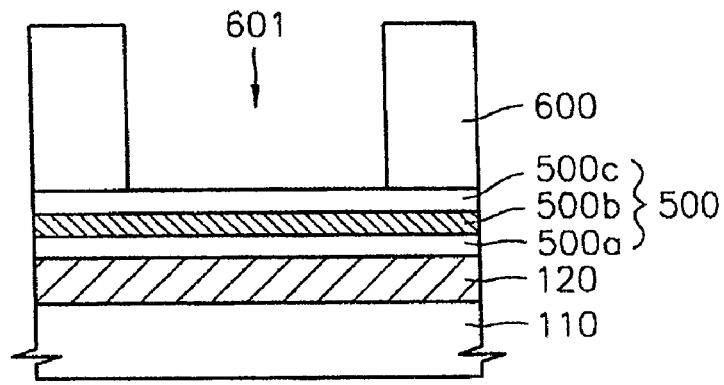

Referring to FIG. 5B, an oxide-silicon-oxide (ONO) dielectric layer 500 is formed on a Si channel region of the silicon layer 120. The ONO dielectric layer 500 can be formed by a known method and substantially includes a silicon oxide layer 500a, a silicon nitride layer 500b, and a silicon oxide layer 500c, which are sequentially stacked. Each of the silicon oxide layers 500a and 500c may be formed of a thermal oxide layer, a chemical-vapor-deposition (CVD) layer, or a combination thereof. Afterwards, the silicon oxide layers 500a and 500c may be thermally treated to obtain a dense and stable resultant structure. Here, the thermal treatment may be performed at a temperature of about 700° C. to 1100° C.

A buffer layer 600 may be formed on the entire surface of the ONO dielectric layer 500. Afterwards, the buffer layer 600 is patterned using photolithographic and etching processes so as to form a trench 601, which exposes a lengthy upper portion of the ONO dielectric layer 500, in the buffer layer 600. The etching process may be an isotropic etching process or an anisotropic etching process.

The buffer layer 600 is used to physically separate the ONO dielectric layer 500 of the SONOS into two portions, which will be selectively removed again later. Accordingly, to serve as an appropriate sacrificial layer, the buffer layer 600 is preferably formed of an insulating material having a sufficient etch selectivity with respect to the ONO dielectric layer 500.

Figure 5C:
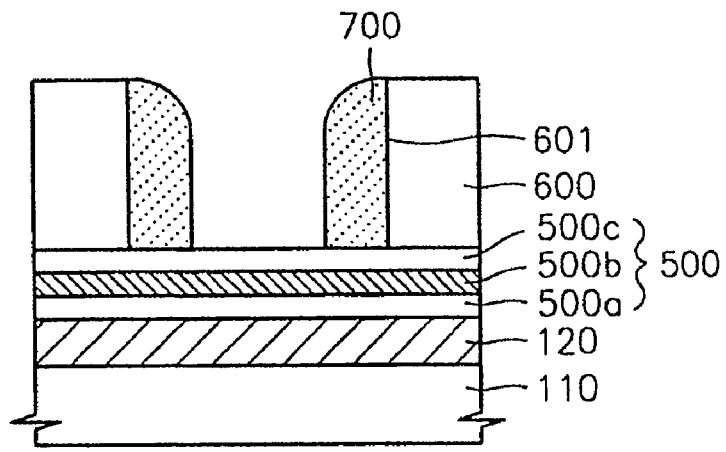

Referring to FIG. 5C, first conductive spacers 700 are formed on the inner walls of the trench 601. To form the first conductive spacers 700, a conductive material is deposited to a predetermined thickness and then anisotropically etched using an etchback process. The conductive material for the first conductive spacers 700 is, for example, conductive polysilicon or conductive amorphous silicon, which are widely used for a gate of a SONOS. To endow conductivity to polysilicon or amorphous silicon, an ion implantation process may be further implemented or doping may be performed in-situ during the deposition process.

Figure 5D:
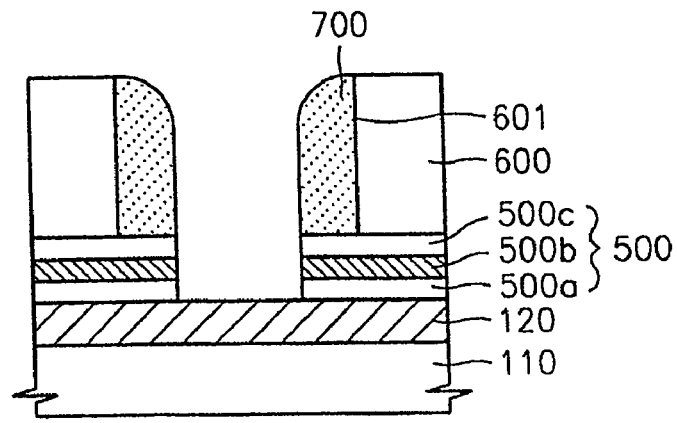

Referring to FIG. 5D, a portion of the ONO dielectric layer 500, which is still exposed after forming the first conductive spacers 700, is removed using the first conductive spacers 700 as an etch mask. Preferably, an anisotropic etch process is used to finely control the linewidth of the removed portion. The linewidth of the etched portion is determined by the linewidth of the trench 601 and the linewidth of the first conductive spacers 700. The etching process allows the silicon layer 120 of the SOI substrate to be exposed. As a result, a central portion of the ONO dielectric layer 500 is removed, thus separating the ONO dielectric layer 500 into two portions.

Figure 5E:
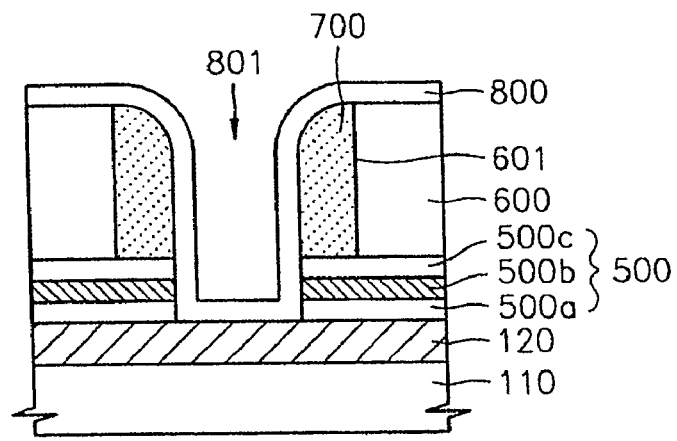

Referring to FIG. 5E, a gate dielectric layer 800 is formed on the silicon layer 120 and the resulting structure shown in FIG. 5D. For example, the gate dielectric layer 800 may be formed of silicon oxide using thermal oxidation or CVD. The gate dielectric layer 800 is formed along the profile of the first conductive spacers 700 such that a concave portion 801 is formed between the first conductive spacers 700. Substantially, the gate dielectric layer 800 may be used as a gate oxide layer between the two-separated ONO dielectric layers. Also, by adjusting the thickness of the gate dielectric layer 800, a short channel effect can be reduced in the SONOS.

Figure 5F:
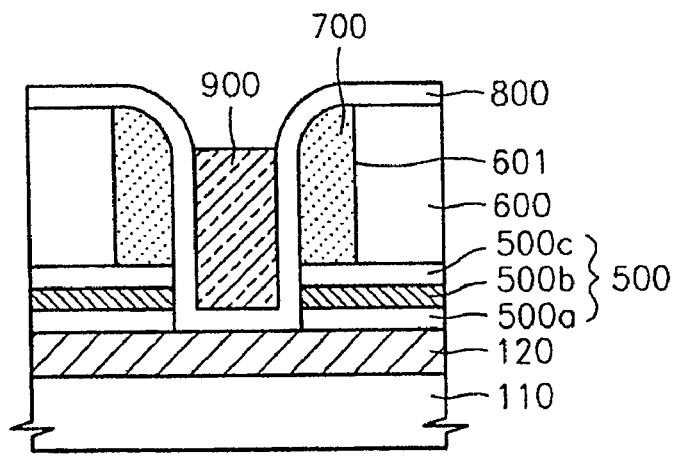

Referring to FIG. 5F, a second conductive layer (not shown) is formed on the gate dielectric layer 800 all over the substrate to fill the concave portion 801, i.e., a gap between the first conductive spacers 700. The second conductive layer may be formed of various conductive materials, for example, conductive polysilicon or amorphous silicon. To endow conductivity to polysilicon or amorphous silicon, an ion implantation process may be further implemented or in-situ doping may be performed during the deposition process. Afterwards, the second conductive layer is etched using an etchback process to form second conductive layer 900, as shown in FIG. 5F, whose top surface is at a lower level than the top surface of the first conductive spacers 700 and limited to inside the trench 601. The etchback process may use an anisotropic etch process or CMP or both. This etchback process also exposes the gate dielectric layer 800 at either side of the second conductive layer 900.

Figure 5G:
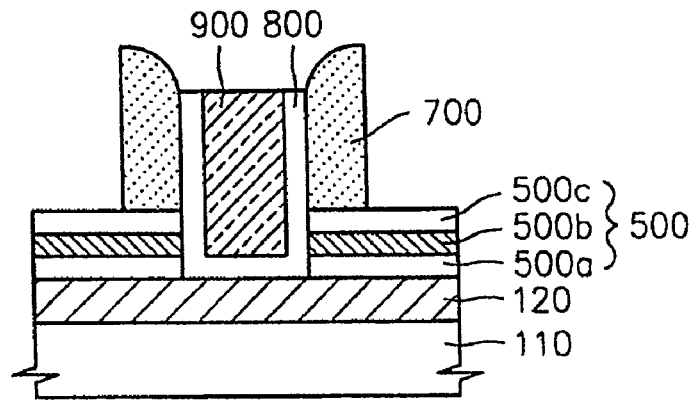

Referring to FIG. 5G, a portion of the gate dielectric layer 800, which is exposed by the second conductive layer 900, is selectively removed to expose the top surface of the first conductive spacers 700 and the top surface of the buffer layer (600 of FIG. 5F). Here, the etch process may be a first wet etch process. Afterwards, the buffer layer 600, exposed by the selective removal of a portion of the gate dielectric layer 800, is also selectively removed until the top surface of the ONO dielectric layer 500 is exposed. To ensure selective removal, the buffer layer 600 is preferably formed of a material having a sufficient etch selectivity with respect to the first conductive spacers 700 and the second conductive layer 900. For example, this etch process may be a second wet etch process that is different from the first wet etch process. Thus, a portion of the ONO dielectric layer 500, which is adjacent to the first conductive spacers 700, is exposed.

Figure 5H:
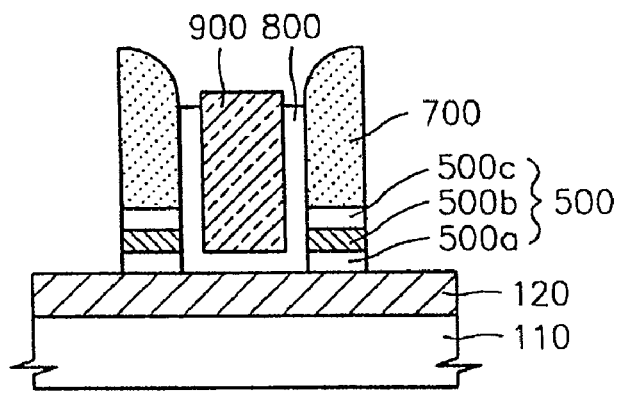

Referring to FIG. 5H, the portion of the ONO dielectric layer 500, which is exposed by the first conductive spacers 700, is selectively removed using the first conductive spacers 700, and the second conductive layer 900 as an etch mask. Thus, twin ONO dielectric layers 500 of the SONOS are patterned. These twin ONO dielectric layers 500 form a symmetric structure through a reverse self-alignment process using the first conductive spacers 700 and the buffer layer 600. Since the gate dielectric layer 800 is positioned between the twin ONO dielectric layers 500, the ONO dielectric layer 500 is physically separated into two portions.

Figure 5I:
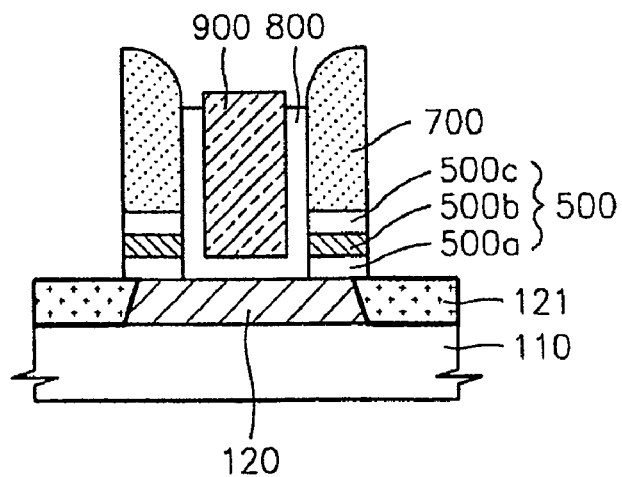

Referring to FIG. 5I, impurity ions are implanted into the silicon layer 120 of the SOI substrate, which is exposed by patterning the twin ONO dielectric layers 500, so as to form a first diffusion layer 121. When the silicon layer 120 is a p-type substrate, the first diffusion layer 121 may be formed of n-type impurity ions, and when the silicon layer 120 is an n-type substrate, the first diffusion layer 121 may be formed of p-type impurity ions.

Figure 5J:
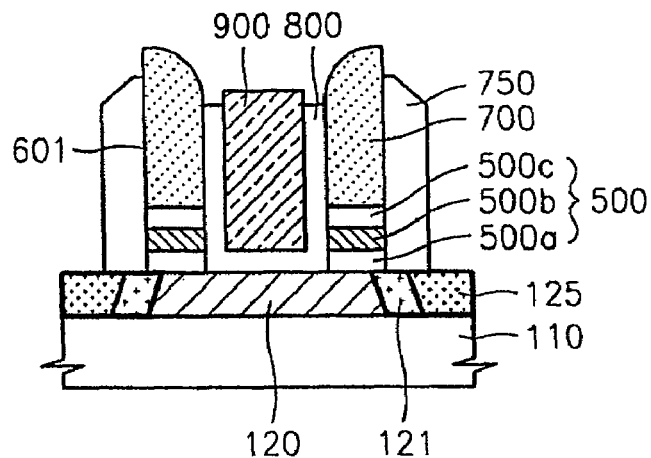

Referring to FIG. 5J, second insulating spacers 750 are formed on the exposed sidewalls of the first conductive spacers 700. The second insulating spacers 750 are formed of an insulating material, such as silicon nitride or silicon oxide, using thermal oxidation or CVD followed by an anisotropic etch process. Impurity ions are implanted into the exposed first diffusion layer 121 (formed earlier in silicon layer 120, as shown in FIG. 5I) using the second insulating spacers 750 as an ion implantation mask, thereby forming a second diffusion layer 125. The first diffusion layer 121 and the second diffusion layer 125 together serve as a source and a drain of a SONOS memory cell.

Figure 5K:
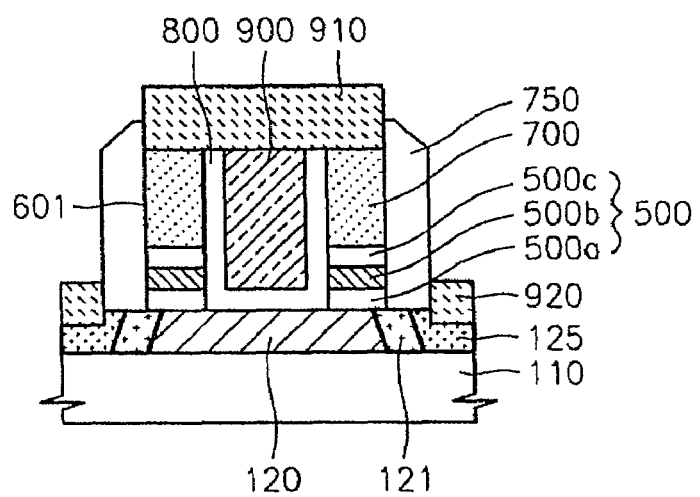

Referring to FIG. 5K, a first silicide layer 910 is formed to electrically connect the first conductive spacers 700 and the second conductive layer 900, and a second silicide layer 920 is formed for being electrically connected to the first diffusion layer 121 through the second diffusion layer 125. If the first conductive spacers 700 and the second conductive layer 900 are preferably formed of conductive polysilicon, the first silicide layer 910 and the second silicide layer 920 are selectively formed using silicidation.

Afterwards, subsequent processes can follow a typical method of manufacturing a semiconductor device.

Thus, the afore-described processes result in the formation of two-separated and symmetric twin ONO dielectric layers 500 as shown in FIG. 5K. Thus, dispersion of electrons and holes, which are generated during programming and erasing, can be adjusted appropriately. Also, the gate dielectric layer 800, formed between the two-separated ONO dielectric layers 500, can function as a gate oxide layer of the second conductive layer 900. Here, the thickness of the gate dielectric layer 800 can be adjusted independent of the thickness of the ONO dielectric layer 500. Thus, since the thickness of the gate dielectric layer 800 or the gate oxide layer can be appropriately adjusted, a short channel phenomenon can be reduced.

Further, in the first embodiment described with reference to FIGS. 5A through 5K, a reverse self-alignment process is used so as to overcome photolithographic limitations of the minimal linewidth. Thus, the symmetric twin ONO dielectric layers 500 can be effectively formed.

EMBODIMENT 2

A Twin-ONO-Type SONOS with 3 Gates

The second embodiment, unlike the first embodiment, deals with a triple-gate-type SONOS memory device. The same reference numerals in the first and second embodiments represent the same element.

FIGS. 6A through 6J are schematic cross-sectional views illustrating a twin-ONO-type SONOS memory according to the second embodiment of the present invention.

Figure 6A:
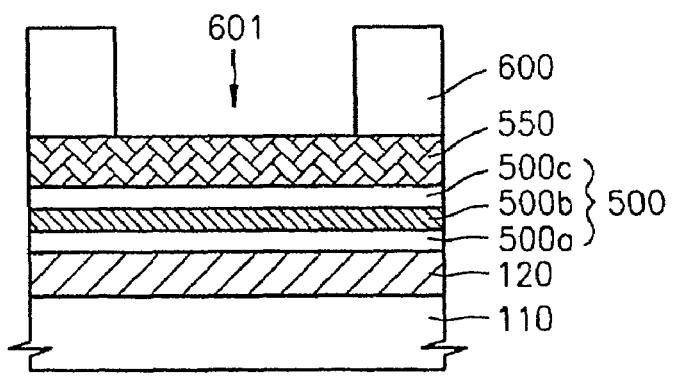
FIGS. 6A through 6J are schematic cross-sectional views illustrating a twin-ONO-type SONOS memory according to a second embodiment of the present invention.

Referring to FIG. 6A, as described with reference to FIG. 5A, a silicon (120)-on-insulator (110) substrate is prepared as a starting material to manufacture a SONOS memory. Afterwards, as described with reference to FIG. 5B, an ONO dielectric layer 500 for a memory is formed on a Si channel region of the silicon layer 120.

A first conductive layer 550 is formed on the ONO dielectric layer 500. The first conductive layer 550 may be formed of various conductive materials, for example, conductive polysilicon or amorphous silicon. As described with reference to FIG. 5B, a buffer layer 600 is formed on the entire surface of the first conductive layer 550. Afterwards, the buffer layer 600 is patterned using photolithographic and etching processes so as to form a trench 601, which exposes a lengthy portion of the top surface of the first conductive layer 550, in the buffer layer 600.

Figure 6B:
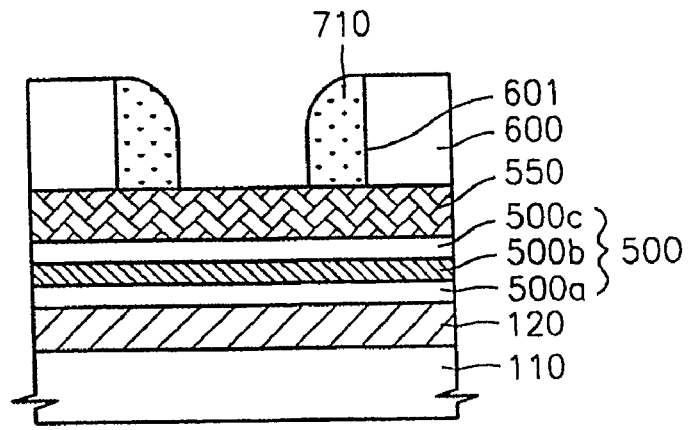

Referring to FIG. 6B, first insulating spacers 701 are formed on the inner walls of the trench 601. The first insulating spacers are preferably formed of an insulating material that is other than the buffer layer 600 and has a sufficient etch selectivity with respect to the buffer layer 600. To form the first insulating spacers 710, an insulating material is deposited to a predetermined thickness and then anisotropically etched using an etchback process.

Figure 6C:
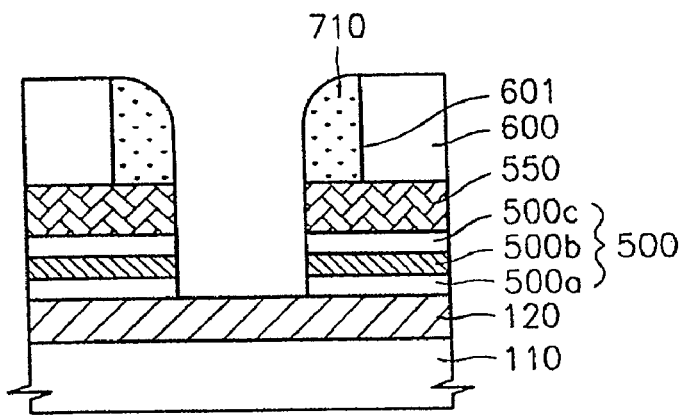

Referring to FIG. 6C, a portion of the first conductive layer 550, which is exposed by the first insulating spacers 710, and then a portion of the ONO dielectric layer 500, which is originally under the first conductive layer 550, are removed using the first insulating spacers 710 as an etch mask. Preferably, an anisotropic etch process is used to finely control the linewidth of the removed portions. The linewidth of the etched portion is determined by the linewidth of the trench 601 and the linewidth of the first insulating spacers 710. The etching process allows the silicon layer 120 of the SOI substrate to be exposed.

Figure 6D:
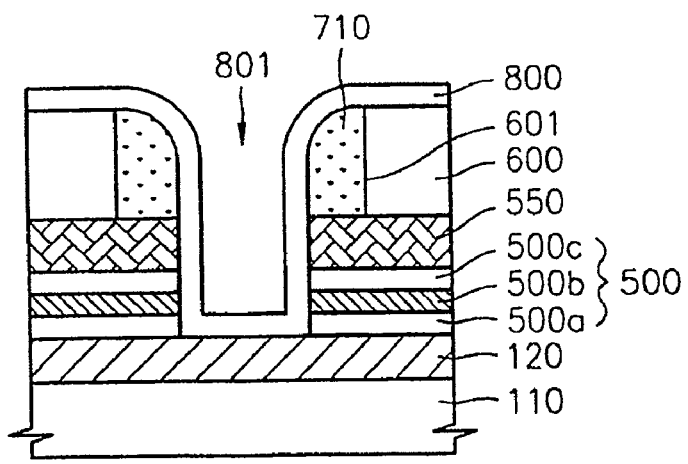

Referring to FIG. 6D, as also described with reference to FIG. 5E, a gate dielectric layer 800 is formed on the silicon layer 120 such that a concave portion 801 is formed between the first insulating spacers 710.

Figure 6E:
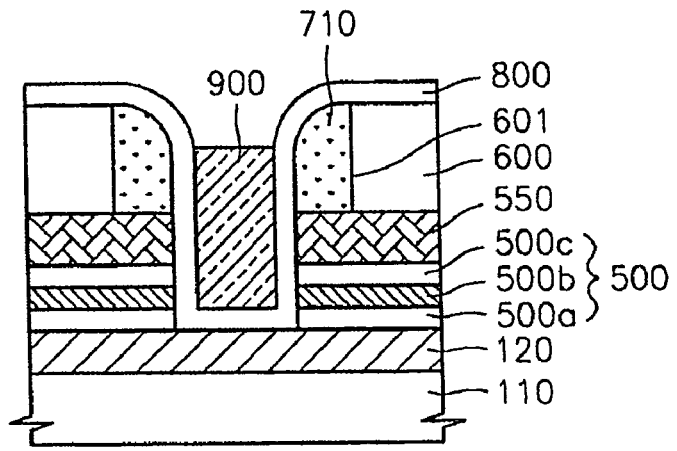

Referring to FIG. 6E, as also described with reference to FIG. 5F, a second conductive layer is formed (not shown) all over on the gate dielectric layer 800 to fill the concave portion 801, i.e., a gap between the first insulating spacers 710. The second conductive layer is preferably formed of conductive silicon. Afterwards, the second conductive layer is etched using an etchback process to form the second conductive layer 900 shown in FIG. 5F. The etching is done until the top surface of the second conductive layer 900 is at a lower level than the top surface of the first insulating spacers 710. This etching step also exposes the gate dielectric layer 800 at either side of the second conductive layer 900. The etchback process may use an anisotropic etch process or CMP or both.

Figure 6F:
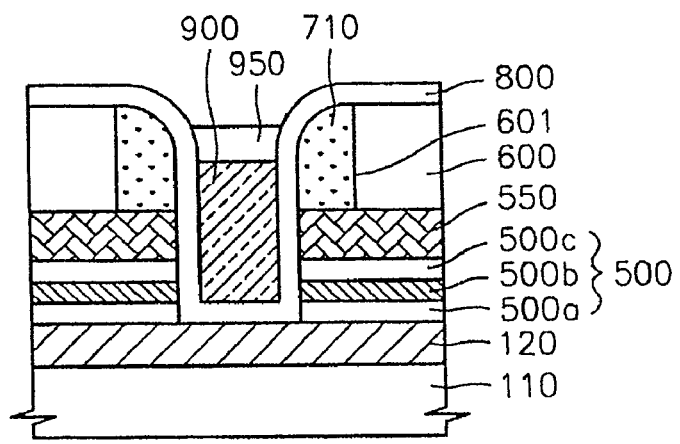

Referring to FIG. 6F, a capping insulating layer 950 is formed on the second conductive layer 900 and connected to the exposed gate dielectric layer 800. When the second conductive layer 900 is preferably formed of conductive polysilicon, then the capping insulating layer 950 can be formed by oxidizing the top surface of the second conductive layer 900 to a predetermined depth.

Figure 6G:
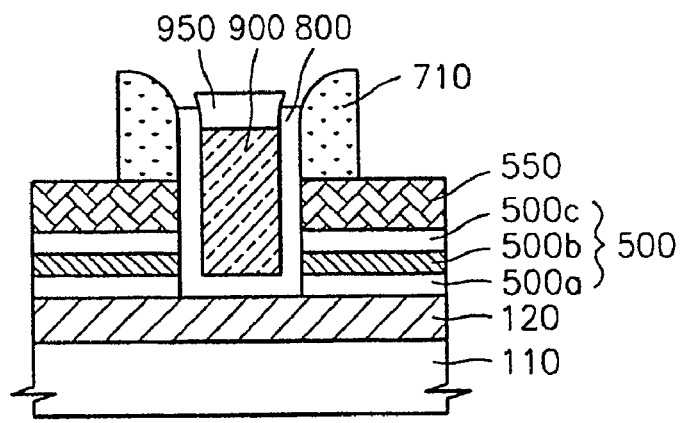

Referring to FIG. 6G, a portion of the gate dielectric layer 800, which is exposed at either side of the capping insulating layer 950, is selectively removed to expose the top surface of the first insulating spacers 710 and the top surface of the buffer layer (600 of FIG. 6F). Here, the etch process may be a first wet etch process. Afterwards, the buffer layer 600, which is exposed by the first insulating spacers 710 after the selective removal of a portion of the gate dielectric layer 800, is also selectively removed until the top surface of the first conductive layer 550 is exposed. Here, the buffer layer 600 is preferably removed having a sufficient etch selectivity with respect to the first insulating spacers 710 and the capping insulating layer 950. For example, this etch process may be a second wet etch process that is different from the first wet etch process.

Figure 6H:
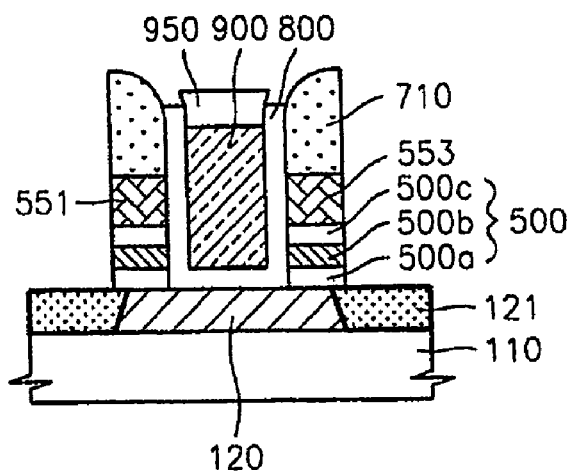

Referring to FIG. 6H, the portion of the first conductive layer 550, which is exposed by the first insulating spacers 710, is selectively removed using the first insulating spacers 710 as an etch mask. Thus, the first conductive layer 550 is patterned, and patterned portions of the first conductive layer 550 become a first gate 551 and a second gate 553.

A portion of the ONO dielectric layer 500, which is exposed adjacent to the first gate 551 and the second gate 553, is then selectively removed. Thus, as also described with FIG. 5H, twin ONO dielectric layers 500 of the SONOS are patterned. Afterwards, as also described with reference to FIG. 5I, impurity ions are implanted into the silicon layer 120 of the SOI substrate, which is exposed by patterning the twin ONO dielectric layers 500, so as to form a first diffusion layer 121.

Figure 6I:
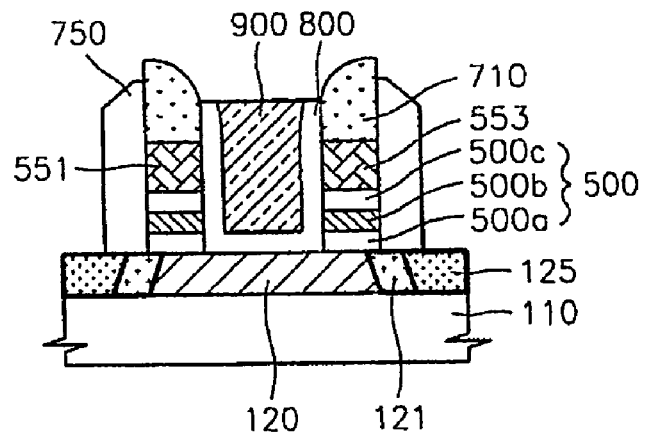

Referring to FIG. 6I, second insulating spacers 750 are formed on the exposed sidewalls of the first insulating spacers 710, the sidewalls of the first and second gates 551 and 553 and the underlying twin ONO dielectric layers 500. To form the second insulating spacers 750, an insulating material is deposited and then etched using an anisotropic etch process. Impurity ions are implanted into the exposed silicon layer 120, thereby forming a second diffusion layer 125. Afterwards, the capping insulating layer (950 of FIG. 6H), which may remain on the second conductive layer 900, is selectively removed until the top surface of the second conductive layer 900 is exposed. The second conductive layer 900 becomes a third gate independent of the first gate 551 and the second gate 553.

Figure 6J:
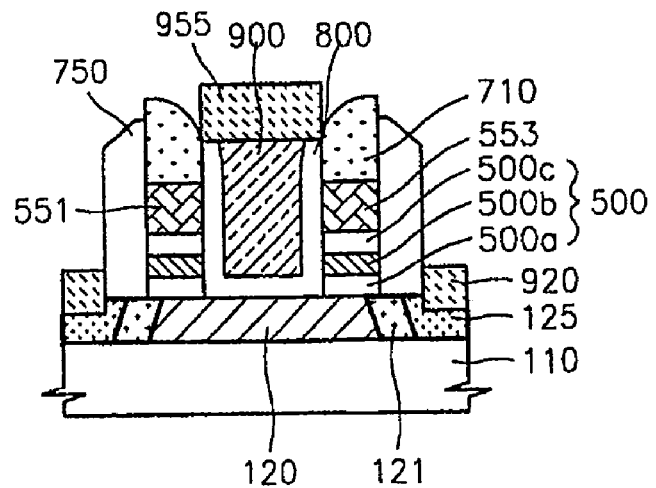

Referring to FIG. 6J, a third silicide layer 955 is formed for being electrically connected to the second conductive layer 900, and a second silicide layer 920 is formed for being electrically connected to the first diffusion layer 121 through the second diffusion layer 125. If the second conductive layer 900 is preferably formed of conductive polysilicon, the third silicide layer 955 and the second silicide layer 920 are selectively formed using silicidation.

Afterwards, subsequent processes can follow a typical method of manufacturing a semiconductor device.

Thus, in the second embodiment of the present invention, by using the afore-described processes with reference to FIGS. 6A through 6J, two-separated and symmetric twin ONO dielectric layers 500 as well as 3 independent gates are formed.

EMBODIMENT 3

An Example Twin-ONO-Type SONOS with a Single Gate

The third embodiment of the present invention is directed to a transformed SONOS memory with a single gate. The same reference numerals in the first, second and third embodiments represent the same element.

FIGS. 7A through 7K are schematic cross-sectional views illustrating a twin-ONO-type SONOS memory according to the third embodiment of the present invention.

Figure 7A:
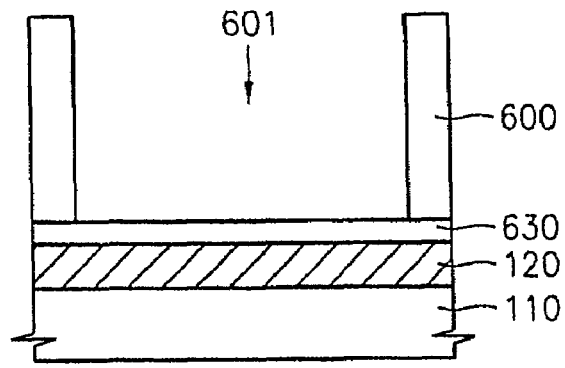
FIGS. 7A through 7K are schematic cross-sectional views illustrating a twin-ONO-type SONOS memory according to a third embodiment of the present invention.

Referring to FIG. 7A, as described with reference to FIG. 5A, a silicon (120)-on-insulator (110) substrate is prepared as a starting material to manufacture a SONOS memory. Then, a first buffer layer 630 and a second buffer layer 600 are formed. As also described with reference to FIG. 5B, the second buffer layer 600 is used as a sacrificial layer during patterning of a subsequent ONO dielectric layer 500. The first buffer layer 630 is used to prevent etching damage of the silicon layer 120 during patterning or removal of the second buffer layer 600. The second buffer layer 600 can function as a pad layer or an etch stopper. Thus, the first buffer layer 630 may be formed of an insulating material that is other than the second buffer layer 600 and has an etch selectivity with respect to the second buffer layer 600.

Thereafter, as also described with reference to FIG. 5B, the second buffer layer 600 is patterned using an anisotropic etch process, thereby forming a trench 601.

Figure 7B:
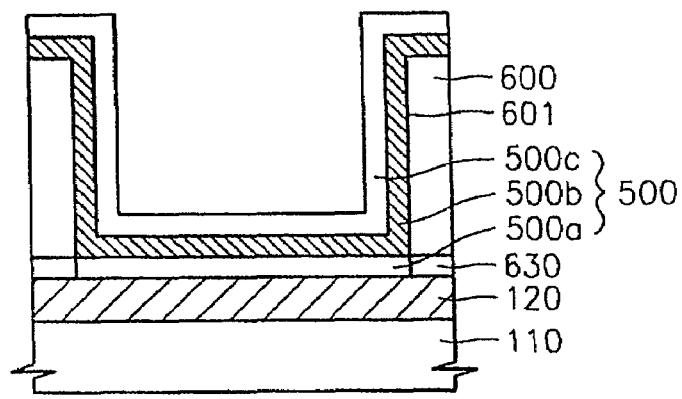

Referring to FIG. 7B, a portion of the first buffer layer (630 of FIG. 7A), which may remain on the bottom part of the trench 601, is removed using a wet etch process until the top surface of the silicon layer 120 is exposed. Afterwards, an ONO dielectric layer 500 for a memory is stacked on a Si channel region of the silicon layer 120 and on the sidewalls of the trench 601 of the second buffer layer 600. Here, the ONO dielectric layer 500 can be formed by a known method. Substantially, as also described with reference to FIG. 5B, each of silicon oxide layers 500a and 500c may be formed of a thermal oxide layer or a CVD layer. The oxide layer 500a shown in FIGS. 7B-7K is formed by a thermal oxidation step. Due to this reason, the oxide layer 500a is not formed on the sidewalls of the trench 601 in the second buffer layer 600, which may be a nitride layer. The nitride layer 500b and the oxide layer 500c may be formed by a CVD process, resulting the presence of these two layers on the sidewalls of the trench 601.

Figure 7C:
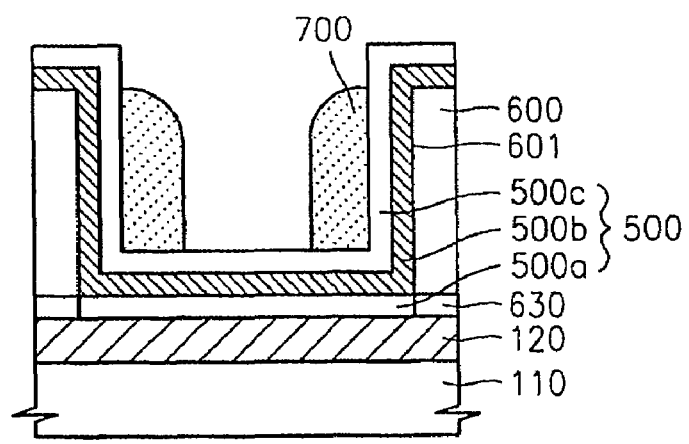

Referring to FIG. 7C, as also described with reference to FIG. 5C, first conductive spacers 700 are formed on the ONO dielectric layer 500 formed on the inner walls of the trench 601. The first conductive spacers may be formed of conductive silicon.

Figure 7D:
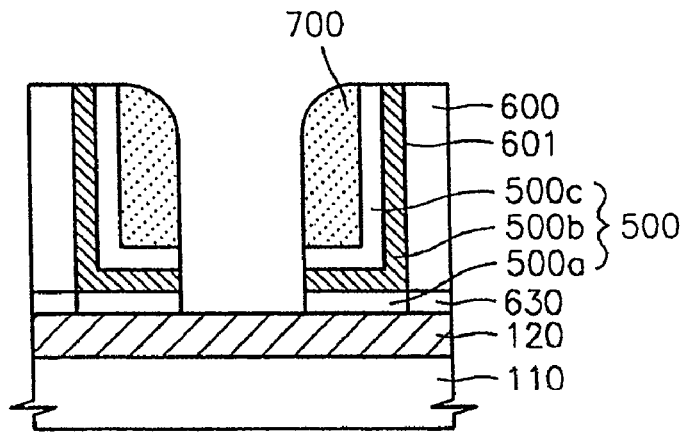

Referring to FIG. 7D, a portion of the ONO dielectric layer 500, which is exposed by the first conductive spacers 700, is selectively removed using the first conductive spacers as an etch mask. As described with reference to FIG. 5D, an anisotropic etch process is preferably used. Thus, a silicon layer 120 of the SOI substrate is exposed. The anisotropic etch process also removes ONO dielectric layers formed on a top surface of the second buffer layer 600 exposing the top surface of the second buffer layer 600.

Figure 7E:
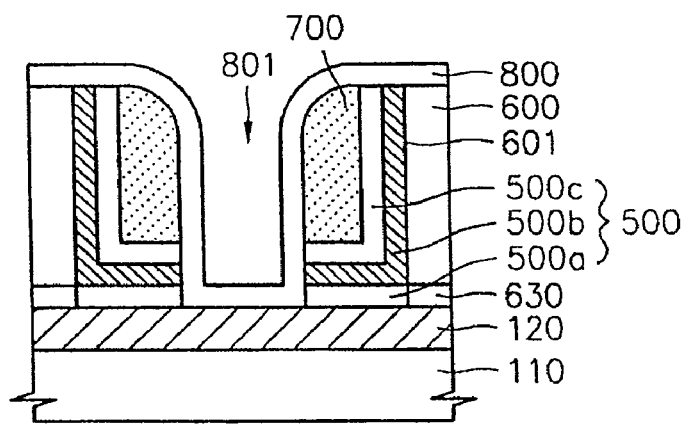

Referring to FIG. 7E, as also described with reference to FIG. 5E, a gate dielectric layer 800 is formed on the exposed silicon layer 120 such that a concave portion 801 is formed between the first conductive spacers 700. Here, the gate dielectric layer 800 can be extended onto the second buffer layer 600, which will be exposed during an etch process as described with reference to FIG. 7D. The gate dielectric layer is formed of silicon oxide using thermal oxidation or CVD.

Figure 7F:
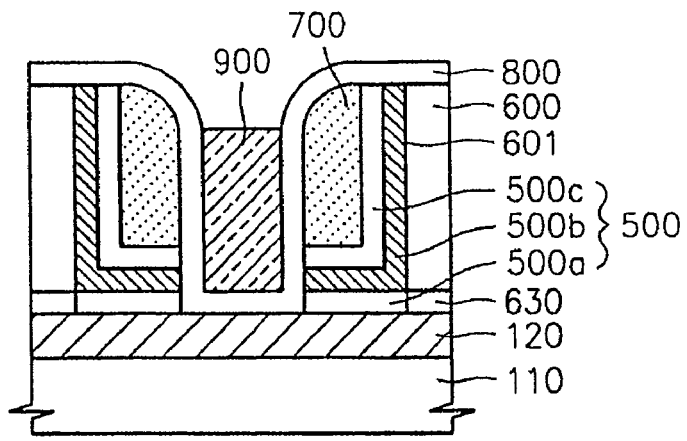

Referring to FIG. 7F, as described with reference to FIG. 5F, a second conductive layer 900 is formed on the gate dielectric layer 800 to fill the concave portion 801, i.e., a gap between the first conductive spacers 700. The top surface of the second conductive layer 900 is formed at a lower level than the top surface of the first conductive spacers 700, using the same procedure as described with reference to FIG. 5F. The second conductive layer may be formed of conductive silicon.

Figure 7G:
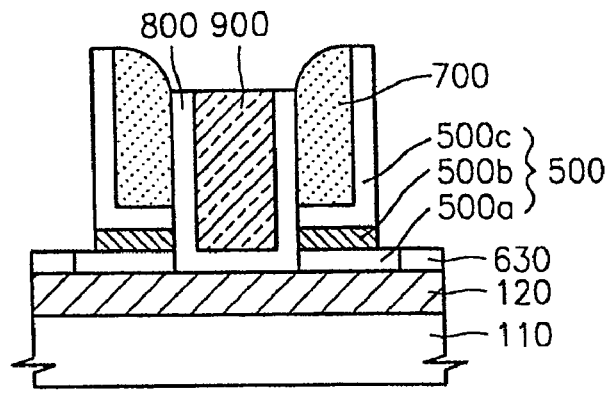

Referring to FIG. 7G, as described with reference to FIG. 5G, a portion of the gate dielectric layer 800, which is exposed by the second conductive layer 900, is selectively removed using a first wet etch process to expose the top surface of the first conductive spacers 700 and the top surface of the second buffer layer (600 of FIG. 7F). Afterwards, as also described with reference to FIG. 5G, the second buffer layer 600, which is exposed by the selective etching of the gate dielectric layer 800, is selectively removed using a second wet etch process. Here, if the second buffer layer 600 is preferably formed of an insulating material that is similar to a silicon nitride layer 500b of the ONO dielectric layer 500, for example, silicon nitride, while the second buffer layer 600 is being removed, a portion of the exposed silicon nitride layer 500b of the ONO dielectric layer 500 may also be removed. Nevertheless, an ONO dielectric layer portion, which is touching the silicon layer 120 and is used as a substantial gate ONO dielectric layer 500 in the SONOS, can be protected by the upper silicon oxide layer 500c of the ONO dielectric layer 500.

Figure 7H:
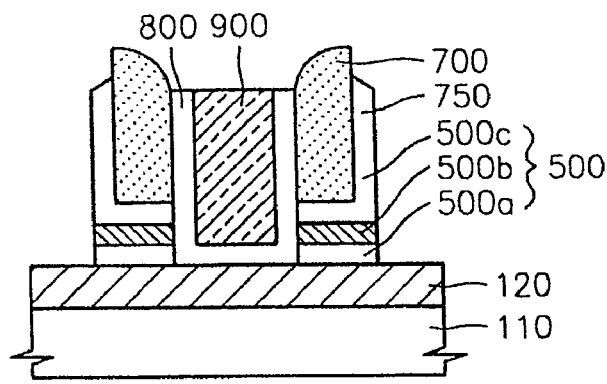

Referring to FIG. 7H, a portion of the ONO dielectric layer 500, which is exposed by the first conductive spacers 700, (i.e., a portion of the lower silicon oxide layer 500a and the remaining portion of the first buffer layer 630) is selectively removed using the first conductive spacers 700 and the second conductive layer 900 as an etch mask. Thus, twin ONO dielectric layers 500 of the SONOS are patterned. Unlike in the first embodiment, even after the ONO dielectric layer 500 is patterned, the silicon oxide layer 500c of the ONO dielectric layer 500 is still extended to the sidewalls of the first conductive spacers 700. Nevertheless, the patterned ONO dielectric layer 500 is used as a substantial ONO dielectric layer of the SONOS as in the first embodiment.

Figure 7I:
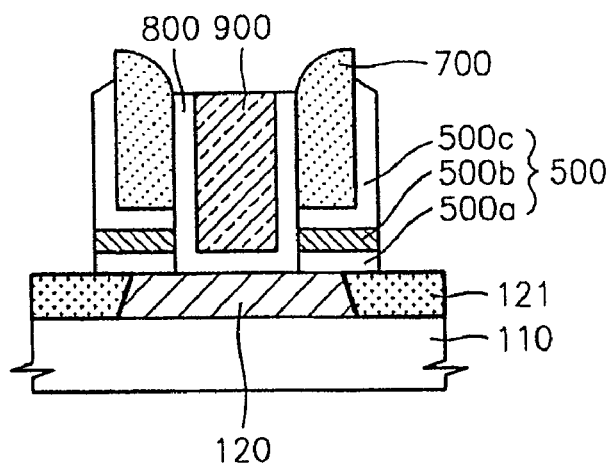

Referring to FIG. 7I, as also described with reference to FIG. 5I, impurity ions are implanted into the silicon layer 120 of the SOI substrate, which is exposed by patterning the twin ONO dielectric layers 500, so as to form a first diffusion layer 121.

Figure 7J:
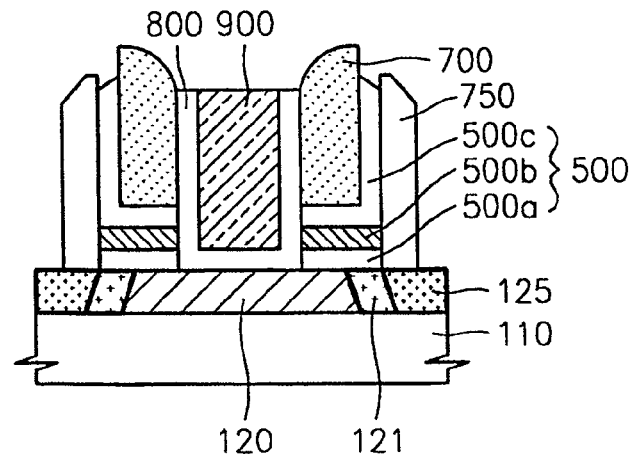

Referring to FIG. 7J, as also described with reference to FIG. 5J, second insulating spacers 750 are formed on the upper silicon oxide layer 500c of the ONO dielectric layer 500, which is extended to the sidewalls of the first conductive spacers 700. Afterwards, as also described with reference to FIG. 5J, impurity ions are implanted into the exposed silicon layer 120 using the second insulating spacers 750 as an ion implantation mask, thereby forming a second diffusion layer 125.

Figure 7K:
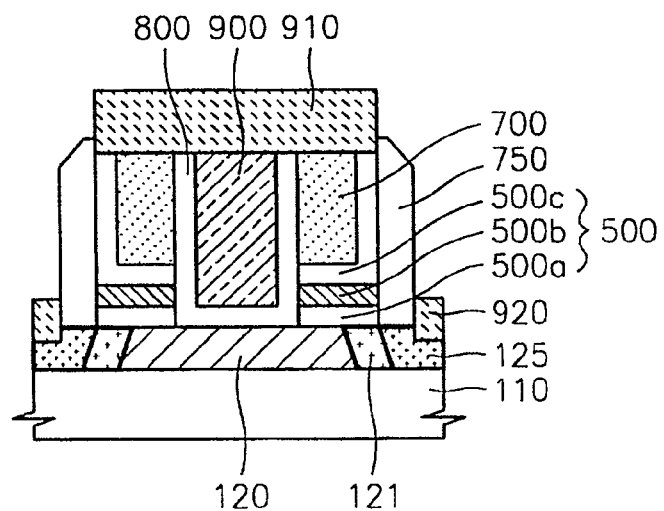

Referring to FIG. 7K, as also described with reference to FIG. 5K, a first silicide layer 910 is formed to electrically connect the first conductive spacers 700 to the second conductive layer 900, and a second silicide layer 920 is formed and is electrically connected to the first diffusion layer 121 through the second diffusion layer 125.

Afterwards, subsequent processes can follow a typical method of manufacturing a semiconductor device.

Thus, in the third embodiment of the present invention, by using the afore-described processes with reference to FIGS. 7A through 7K, two-separated and symmetric twin ONO dielectric layers 500 are formed.

EMBODIMENT 4

Another Twin-Type SONOS Example with a Single Gate

The fourth embodiment of the present invention is directed to another transformed example of a SONOS with a single gate. The same reference numerals in the first and fourth embodiments represent the same element.

FIGS. 8A through 8J are schematic cross-sectional views illustrating a twin-ONO-type SONOS memory according to a fourth embodiment of the present invention.

Figure 8A:
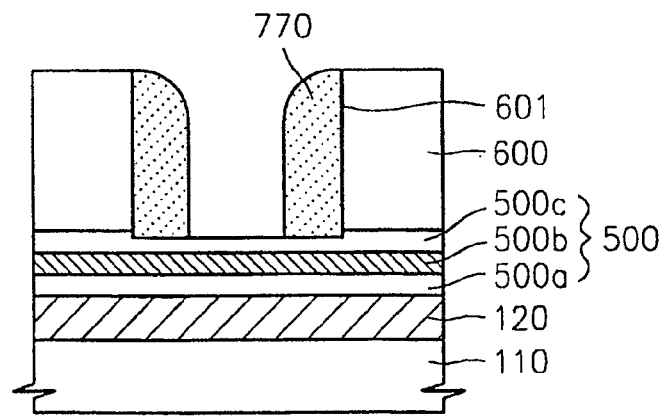
FIGS. 8A through 8J are schematic cross-sectional views illustrating a twin-ONO-type SONOS memory according to a fourth embodiment of the present invention.

Referring to FIG. 8A, as also described with reference to FIG. 5A, a silicon (120)-on-insulator (110) substrate is prepared as a starting material to manufacture a SONOS memory. Afterwards, as also described with reference to FIG. 5B, an ONO dielectric layer 500 is formed, and a buffer layer 600 having a trench 601 is formed on the SOI substrate where the ONO dielectric layer 500 is formed. Next, first insulating spacers 770 are formed on the inner walls of the trench 601. Here, unlike the first conductive spacers 700 shown in FIG. 5C, the first insulating spacers 770 may be formed of an insulating material other than the buffer layer 600 or a photoresist material. The first insulating spacers 770 are used as a sacrificial layer unlike the first insulating spacers 710 in the second embodiment.

Figure 8B:
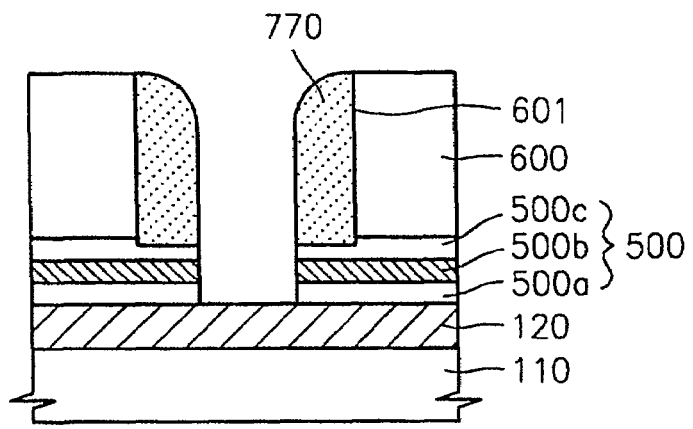

Referring to FIG. 8B, as also described with reference to FIG. 5D, a portion of the ONO dielectric layer 500, which is exposed by the first insulating spacers 770, is removed using the first insulating spacers 770 as an etch mask, so as to separate the ONO dielectric layer 500 into two portions.

Figure 8C:
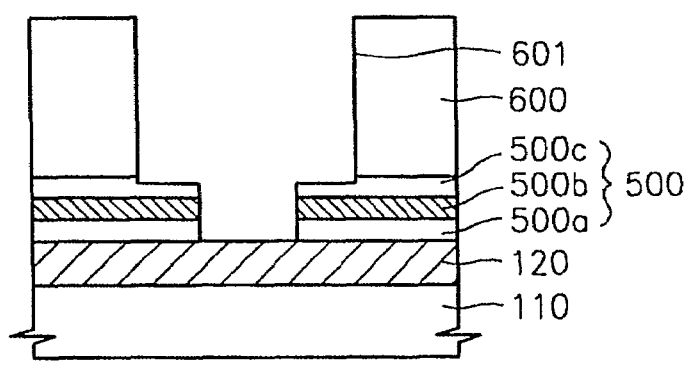

Referring to FIG. 8C, the first insulating spacers 770 are removed.

Figure 8D:
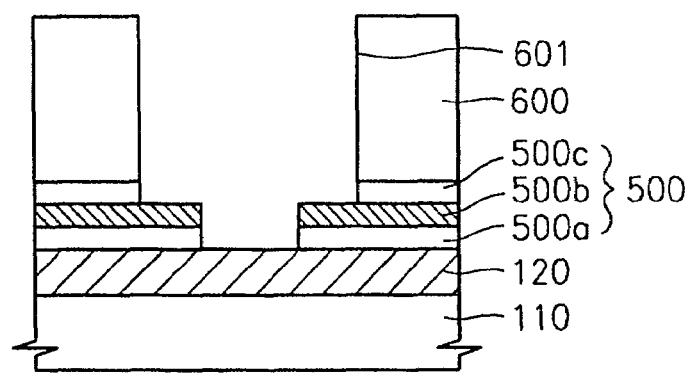

Referring to FIG. 8D, a portion of the upper silicon oxide layer 500c, which is exposed by removing the first insulating spacers 770, is selectively removed using the buffer layer 600 as an etch mask, so as to expose a portion of the silicon nitride layer 500b.

Figure 8E:
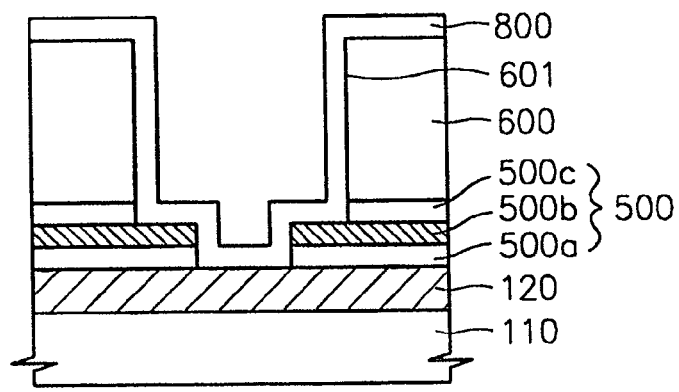

Referring to FIG. 8E, as also described with reference to FIG. 5E, a gate dielectric layer 800 is formed to cover the exposed silicon layer 120, exposed silicon nitride layer 500b and the buffer layer 600. For example, the gate dielectric layer 800 may be formed of silicon oxide using thermal oxidation or CVD.

Figure 8F:
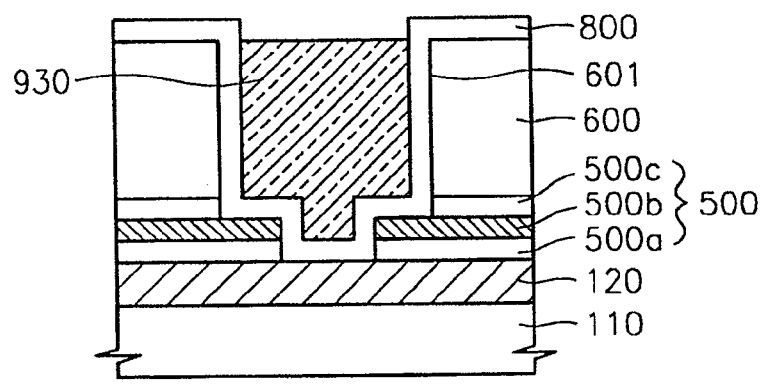

Referring to FIG. 8F, a conductive layer 930 is formed on the gate dielectric layer 800 to fill a gap in the buffer layer 600. The conductive layer may be formed of various conductive materials, such as conductive polysilicon. The conductive layer 930 is formed by blanket deposition followed by etching using an etchback process or CMP or both, so that the conductive layer 930 is limited to inside the trench 601.

Figure 8G:
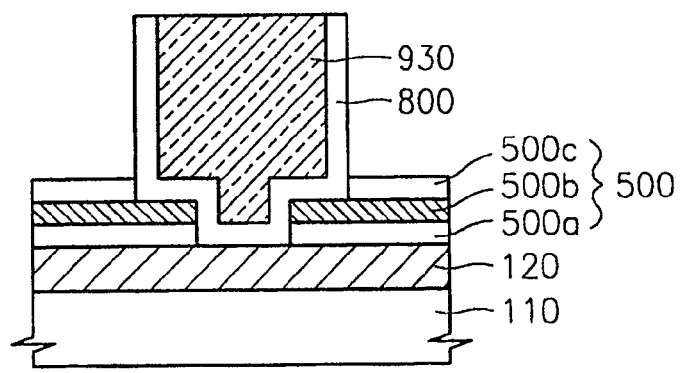

Referring to FIG. 8G, as also described with reference to FIG. 5G, a portion of the gate dielectric layer 800, which is exposed by the conductive layer 930, is selectively removed until the top surface of the buffer layer (600 of FIG. 8F) is exposed. Here, a first wet etch process is preferably used. Afterwards, as also described with reference to FIG. 5G, the exposed buffer layer 600 is selectively removed using a second wet etch process, thereby exposing the top surface of the ONO dielectric layer 500.

Figure 8H:
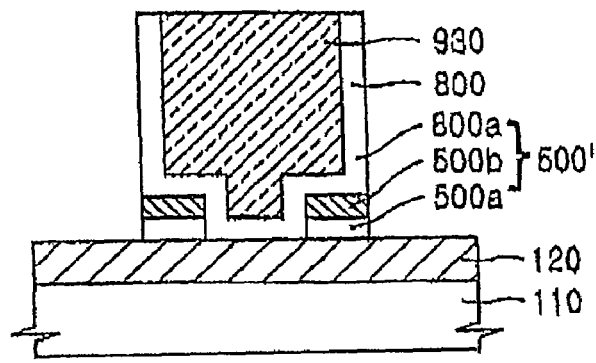

Referring to FIG. 8H, an exposed portion of the ONO dielectric layer 500 is selectively removed using the conductive layer 930 and the gate dielectric layer 800 as an etch mask. Thus, twin ONO dielectric layers 500' of the SONOS are patterned. Substantially, the twin ONO dielectric layers 500' are composed of new elements, i.e., the remaining portion 800a of the gate dielectric layer 800, the silicon nitride layer 500b, and the lower silicon oxide layer 500a.

Figure 8I:
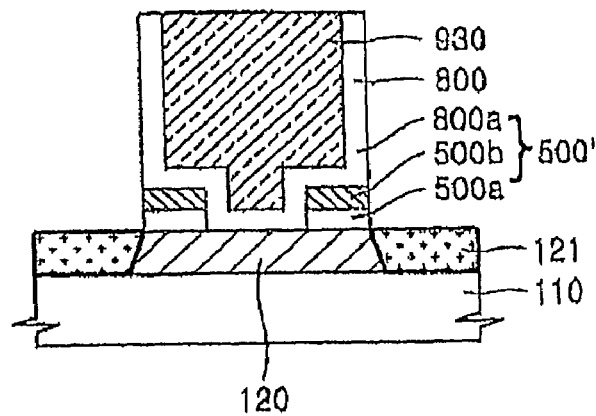

Referring to FIG. 8I, as described with reference to FIG. 5I, impurity ions are implanted into the silicon layer 120 of the SOI substrate 120, which is exposed by patterning the twin ONO dielectric layers 500', thereby forming a first diffusion layer 121.

Figure 8J:
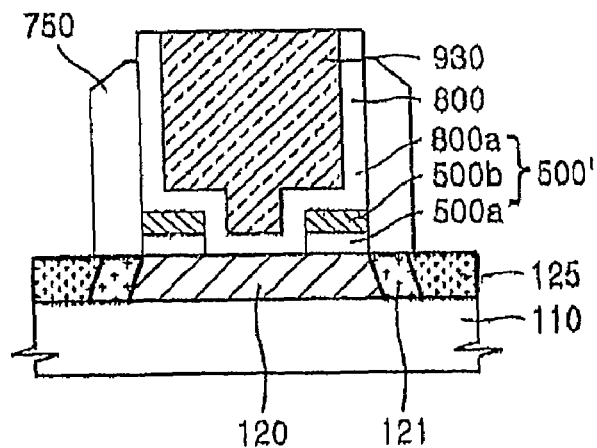

Referring to FIG. 8J, second insulating spacers 750 are formed on the exposed sidewalls of the gate dielectric layer 800. To form the second insulating spacers 750, for example, a silicon nitride layer is deposited and then etched using an anisotropic etch process. As also described with reference to FIG. 5J, impurity ions are implanted into the exposed first diffusion layer 121 using the second insulating spacers 750 and the layers inside the spacers as an ion implantation mask, thereby forming a second diffusion layer 125.

Thus, in the fourth embodiment of the present invention, as described above with reference to FIGS. 8A through 8J, a gate is formed of the conductive layer 930, and a SONOS cell including two-separated twin ONO dielectric layers 500' is formed.

Afterwards, subsequent processes can follow a typical method of manufacturing a semiconductor device.

In the afore-described embodiments, a 2-bit SONOS memory using CHEI can be manufactured by physically separating an ONO dielectric layer disposed under a gate using reverse spacers. By separating the ONO dielectric layer into twin portions, dispersion of electrons and holes, which may be obtained from programming and erasing, can be adjusted appropriately. Also, since the thickness of a gate dielectric layer, which is formed between the two-separated ONO dielectric layers, can be adjusted appropriately, a short channel phenomenon can be suppressed.

Figure 9A:
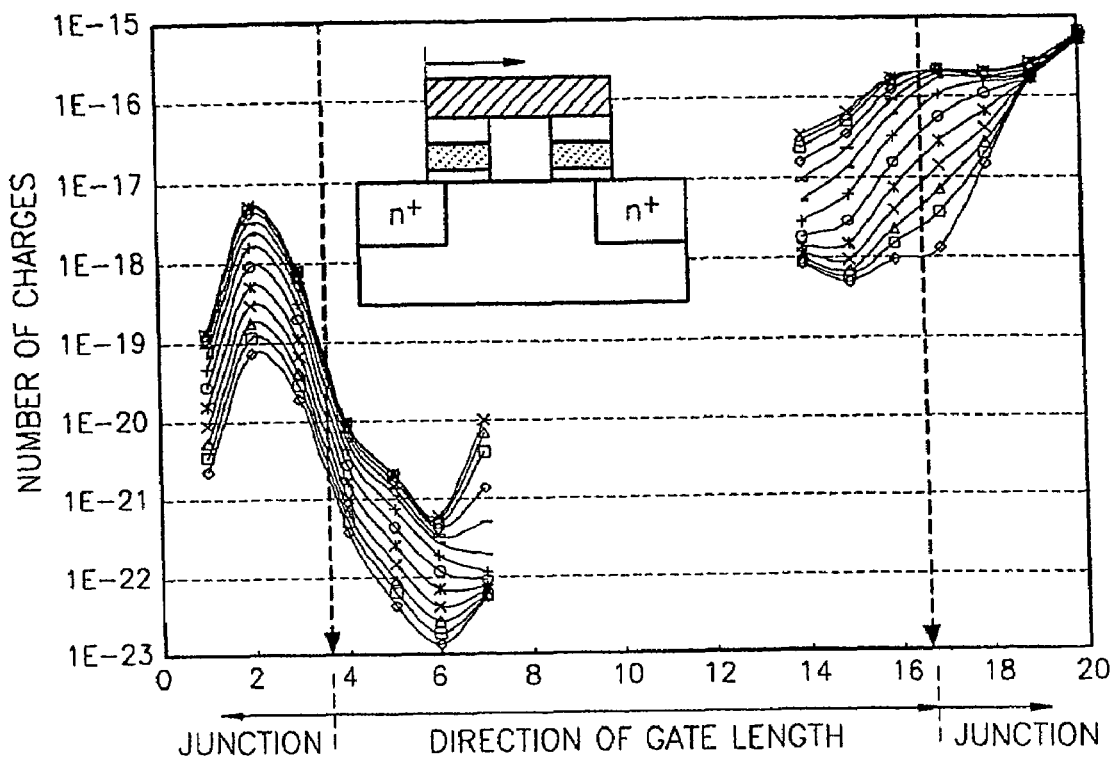
FIGS. 9A and 9B illustrate charge distributions using a simulation model, which explain advantages of the twin-ONO-type SONOS memory according to the embodiments of the present invention.
Figure 9B:
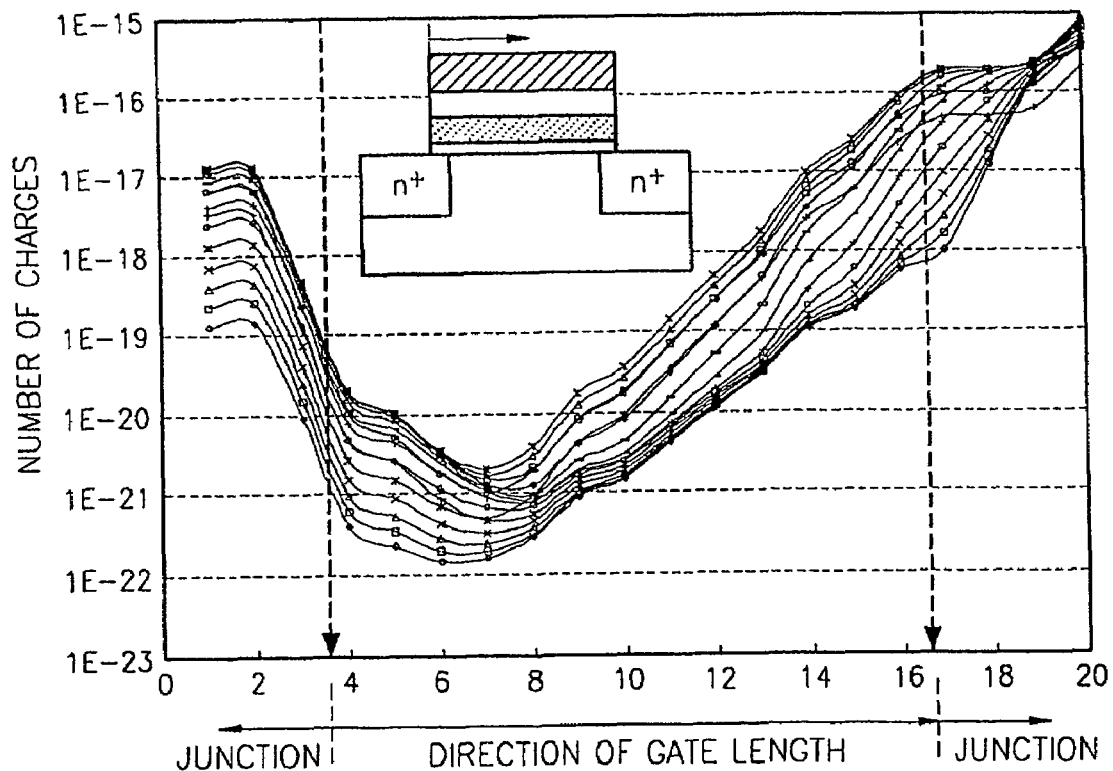

FIGS. 9A and 9B illustrate charge distributions using a simulation model, and explain advantages of the twin-ONO-type SONOS memory according to the embodiments of the present invention.

In both FIGS. 9A and 9B, it is considered that the linewidth of a gate is 0.12 μm, and 5 V and 3 V are applied to the gate and the drain, respectively (here, all the other connections are grounded). Next, programming is performed by applying a stress for 1 μs, and in this state, the degree of dispersion of trapped charges is measured using a simulation model.

FIG. 9A illustrates measurement results of two-separated ONO dielectric layers (i.e., ONO(400 Å) layer/O(400 Å) layer/ONO(400 Å) layer) according to the embodiments of the present invention. On the other hand, FIG. 9B shows measurement results of a conventional structure, in which an ONO dielectric layer (i.e., an ONO (400 Å) layer) is extended over the entire channel region between the source/drain junctions.

While FIG. 9B illustrates expansive dispersion of trapped charges due to a short channel length of 0.12 μm, FIG. 9A illustrates artificially controlled dispersion of programmed charges due to the physical separation of the ONO dielectric layer. In FIG. 9B, tailed charges hinder 2-bit operations. Also, the repeated programming and erasing cycles bring about accumulation of charges in a central channel region between junctions, thereby degrading endurance of the SONOS. Further, as charges are redistributed toward the channel region during a read operation after the programming, the retention characteristic gets worse. Contrary to this, referring to FIG. 9A, the present invention can ameliorate the 2-bit operations, endurance, and retention characteristic.

Meanwhile, in the present embodiments, reverse spacers are formed using a buffer layer with a trench. Thus, even without increasing its dimension in the direction of a gate length, an ONO dielectric layer to be disposed under the spacers can be separated into twin portions to form a precisely symmetric structure. As a result, a 2-bit SONOS with a single gate and two ONO dielectric layers can be obtained using a reverse self-alignment process irrespective of photolithographic limits. Also, after insulating spacers are formed on both sidewalls of a gate, silicidation is carried out to reduce resistances of the gate and junction diffusion regions.

As a consequence, even if the linewidth of a memory gate is 0.10 μm or less, a SONOS nonvolatile memory device with a stable 2-bit characteristic can be manufactured.

Preferred embodiments of the present invention have been disclosed herein and, although specific terms are employed, they are used and are to be interpreted in a generic and descriptive sense only and not for purpose of limitation. For example, the nitride layer in the ONO dielectric layers as described above is used as a charge trapping layer. Such charge trapping layers have charge trapping sites that have good trapping ability for both electrons and holes. While the above description of the present invention is described with reference to a silicon nitride layer, any other insulating material having a charge trapping property, such as an oxide layer with defects, an $Al_2O_3$ layer etc., may be used as the charge trapping layer and are also included within the scope of this invention. Accordingly, it will be understood by those of ordinary skill in the art that various changes in form and details may be made without departing from the spirit and scope of the present invention as set forth in the following claims.

What is claimed is:

1. A SONOS memory, comprising:
   a semiconductor substrate having a source region, a drain region and a channel region between the source and drain regions;
   twin silicon oxide-silicon nitride-silicon oxide (ONO) dielectric layers including a first ONO dielectric layer on the channel region and the source region and a second ONO dielectric layer on the channel region and the drain region;
   a control gate on the channel region, between the twin ONO dielectric layers, the twin ONO dielectric layers extending along at least lower lateral sides of the control gate adjacent the channel region, wherein the twin ONO dielectric layers extend towards the source and drain regions further than the control gate;

a gate dielectric layer extending below the control gate between the twin ONO dielectric layers, wherein a portion of the gate dielectric layer directly contacts the semiconductor substrate;

at least one insulating spacer spaced apart from the gate dielectric layer and directly contacting at least a portion of one upper oxide layer of the twin ONO dielectric layers;

a conductive spacer on the one upper oxide layer and contacting the gate dielectric layer; and a conductive layer contacting the at least one insulating spacer, the conductive spacer, the gate dielectric layer and the control gate, wherein:

at least one of the source and drain regions includes a first impurity region and a second impurity region, the first impurity region being in direct contact with the second impurity region, the first and second impurity regions having different impurity concentrations, the first impurity region extends under at least one of the first and second ONO dielectric layers, and the second impurity region extends under the at least one insulating spacer and laterally away from the channel region, such that part of the second impurity region is not under the at least one insulating spacer.

2. The SONOS memory as claimed in claim 1, wherein each portion of the twin ONO dielectric layers is adjacent the control gate and is sandwiched between the gate dielectric layer and a respective one of the insulating spacers such that each of the layers of each of the twin ONO dielectric layers directly contacts the gate dielectric layer on one side and directly contacts the respective insulating spacer on another side thereof.

3. The SONOS memory as claimed in claim 1, wherein at least one portion of the twin ONO dielectric layers is coextensive with a height of the control gate.

4. The SONOS memory as claimed in claim 3, wherein an upper portion of the twin ONO dielectric layers is coextensive with the height of the control gate.

5. The SONOS memory as claimed in claim 4, wherein the upper portion extends from the gate dielectric layer along sides of the control gate such that the upper portion of the twin ONO dielectric layers and the gate dielectric layer correspond to portions of a single continuous dielectric layer.

6. The SONOS memory as claimed in claim 5, wherein the control gate and opposing conductive spacers on the upper oxide layers are arranged in a substantially T-shaped structure and occupy a substantially T-shaped space defined by the gate dielectric layer and the upper portions of the twin ONO dielectric layers, wherein a portion of the control gate between the twin ONO dielectric layers is closer to the semiconductor substrate than the conductive spacers over the twin ONO dielectric layers.

7. The SONOS memory device as claimed in claim 6, wherein the T-shaped space defined by the gate dielectric layer and the upper portions of the twin ONO dielectric layers is completely filled by a same conductive material, corresponding to the control gate.

8. The SONOS memory as claimed in claim 4, wherein the at least one portion is an upper silicon oxide layer.

9. The SONOS memory as claimed in claim 3, wherein the at least one portion is arranged vertically over the source and drain regions.

10. The SONOS memory as claimed in claim 1, wherein a conductive spacer is on each of the twin ONO dielectric layers.

11. The SONOS memory device as claimed in claim 1, wherein an upper surface of the gate dielectric layer and an upper surface of the control gate extend along a substantially same plane.

12. The SONGS memory device as claimed in claim 1, wherein the gate dielectric layer further surrounds lateral sides of the control gate.

13. A SONOS memory, comprising:

a semiconductor substrate having a source region, a drain region and a channel region between the source and drain regions;

twin silicon oxide-silicon nitride-silicon oxide (ONO) dielectric layers including a first ONO dielectric layer on the channel region and the source region and a second ONO dielectric layer on the channel region and the drain region;

a control gate on the channel region, between the twin ONO dielectric layers, the twin ONO dielectric layers extending along at least lower lateral sides of the control gate adjacent the channel region, wherein the twin ONO dielectric layers extend towards the source and drain regions further than the control gate;

a gate dielectric layer extending below the control gate between the twin ONO dielectric layers;

at least one insulating spacer directly contacting at least a portion of an upper oxide layer of the twin ONO dielectric layers; and an insulating spacer directly contacting a portion of the gate dielectric layer, wherein the gate dielectric layer extends upwards along sidewalls of the control gate and at least partially separates the portion of the control gate over the channel region from other gate portions over the twin ONO dielectric layers.

14. The SONOS memory as claimed in claim 13, wherein the portion of the control gate over the channel region projects further from the semiconductor substrate than other gate portions over the twin ONO dielectric layers.

15. The SONOS memory as claimed in claim 14, further comprising insulating material on the other gate portions over the twin ONO dielectric layers.

16. The SONOS memory device as claimed in claim 13, further comprising a first gate portion on one of the twin ONO dielectric layers and a second gate portion on the other of the twin ONO dielectric layers.

17. The SONOS memory as claimed in claim 16, wherein the insulating layers are formed on the first and second gate portions.

18. The SONGS memory device as claimed in claim 13, wherein the other gate portions are directly sandwiched between a respective portion of the gate dielectric layer and another insulating spacer.

19. The SONGS memory device as claimed in claim 13, wherein the other gate portions are directly sandwiched between a portion of the upper oxide layer of the twin ONO dielectric layers and the insulating spacer.

20. A SONGS memory, comprising:

a semiconductor substrate having a source region, a drain region and a channel region between the source and drain regions;

twin silicon oxide-silicon nitride-silicon oxide (ONO) dielectric layers including a first ONO dielectric layer on the channel region and the source region and a second ONO dielectric layer on the channel region and the drain region;

a control gate on the channel region, between the twin ONO dielectric layers, the twin ONO dielectric layers extending along at least lower lateral sides of the control gate adjacent the channel region, wherein the twin ONO dielectric layers extend towards the source and drain regions further than the control gate;

a continuous gate dielectric layer, the continuous gate dielectric layer extending below the control gate between the twin ONO dielectric layers, directly contacting the semiconductor substrate, and serving as an upper oxide layer of each of the twin ONO dielectric layers; and at least one insulating spacer, the insulating spacer directly contacting the continuous gate dielectric layer and contacting side portions of a charge trap layer and a lower oxide layer of one of the twin ONO dielectric layers.

21. The SONOS memory device as claimed in claim 20, further comprising at least one insulating spacer directly contacting at least a portion of one upper oxide layer of the twin ONO dielectric layers, wherein:

at least one of the source and drain regions includes a first impurity region and a second impurity region, the first impurity region being in direct contact with the second impurity region, the first and second impurity regions having different impurity concentrations, the first impurity region extends under the at least one insulating spacer layer, and the second impurity region extends laterally away from the channel region, such that at least part of the second impurity region is not under the at least one insulating spacer.

22. The SONOS memory device as claimed in claim 20, wherein an upper surface of the continuous gate dielectric layer is level with an upper surface of the control gate.

23. The SONOS memory device as claimed in claim 20, wherein the continuous gate dielectric layer extends along sides of the control gate such that the continuous dielectric layer surrounds the sides of the control gate.

* * * * *